United States Patent
Vare et al.

(10) Patent No.: US 7,974,254 B2
(45) Date of Patent: Jul. 5, 2011

(54) DIGITAL BROADCAST SIGNALING METADATA

(75) Inventors: Jani Vare, Kaarina (FI); Jussi Vesma, Turku (FI); Tero Jokela, Turku (FI)

(73) Assignee: Nokia Corporation (FI)

( * ) Notice: Subject to any disclaimer, the term of this patent is extended or adjusted under 35 U.S.C. 154(b) by 635 days.

(21) Appl. No.: 11/876,543

(22) Filed: Oct. 22, 2007

(65) Prior Publication Data

US 2009/0103649 A1 Apr. 23, 2009

(51) Int. Cl.
H04L 27/04 (2006.01)

(52) U.S. Cl. ........ 370/342; 370/252; 370/389; 370/208; 375/295; 375/133

(58) Field of Classification Search .................. 370/342, 370/335, 343, 349
See application file for complete search history.

(56) References Cited

U.S. PATENT DOCUMENTS

| | | | |
|---|---|---|---|
| 5,930,685 A * | 7/1999 | Straub .............................. | 455/72 |
| 2003/0072255 A1 | 4/2003 | Ma et al. | |
| 2003/0072305 A1 | 4/2003 | Odenwalder et al. | |
| 2004/0057469 A1* | 3/2004 | Nuss et al. ..................... | 370/535 |
| 2004/0082356 A1* | 4/2004 | Walton et al. ................. | 455/522 |
| 2008/0159356 A1* | 7/2008 | Niu et al. ....................... | 375/133 |

FOREIGN PATENT DOCUMENTS

| | | |
|---|---|---|
| WO | 2005122485 A | 12/2005 |
| WO | 2006134032 A | 12/2006 |
| WO | 2007051182 A | 5/2007 |

OTHER PUBLICATIONS

"Digital Video Broadcasting (DVB); DVB Specification for Data Broadcasting; ETSI EN 301 192" ETSI Standards, LIS, Sophia Antipolis Cedex, France, vol. BC, No. V1.4.1, Nov. 1, 2004.
International Search Report from International Application No. PCT/IB2008/002817, dated Jun. 15, 2009, 5 pages.

* cited by examiner

*Primary Examiner* — Ricky Ngo
*Assistant Examiner* — Rasheed Gidado
(74) *Attorney, Agent, or Firm* — Banner & Witcoff, Ltd.

(57) ABSTRACT

Embodiments are directed to transmitting L1 pre-signaling information with predetermined modulation and code rate such that L1 pre-signaling information can be received without preliminary knowledge on the network. L1 pre-signaling information makes it possible to receive the L1 signaling information, data link layer information, and notification data that may have configurable code rates and modulation. Therefore, L1 pre-signaling information can be thought of as signaling metadata (i.e., information about other signaling information). L1 signaling is divided into pre-signaling and signaling parts. The pre-signaling part includes parameters used for receiving the L1 signaling information. L1 pre-signaling signaling enables the receiver to receive the signaling itself (L1 signaling and data link layer information) by informing the receiver about the type of modulation, coding, and the like, used to transmit the L1 signaling, data link layer, and notification information.

30 Claims, 30 Drawing Sheets

| Pilot Symbol 1 coarse frequency and time synchronization, FFT, GI, and modulation fixed 1102 | Signaling Symbol 2 modulation parameters and other signaling data, FFT, GI, and modulation fixed 1104 | Signaling Symbol 3 channel esimtation and fine timing 1106 | Data Symbol 1 1108 | Data Symbol 2 1110 |

FIG. 11 compose a symbol sequence that includes a pilot symbol configured to convey coarse frequency and timing synchronization information as the first symbol followed by a next signaling symbol configured to convey modulation parameters as the second symbol, which is followed by a plurality of data symbols
1202

transmit the symbol sequence on a broadcast channel with a pilot-signal bandwidth that is narrower than a data-signal bandwidth, which is narrower than a channel raster bandwidth of the broadcast channel
1204

FIG. 12

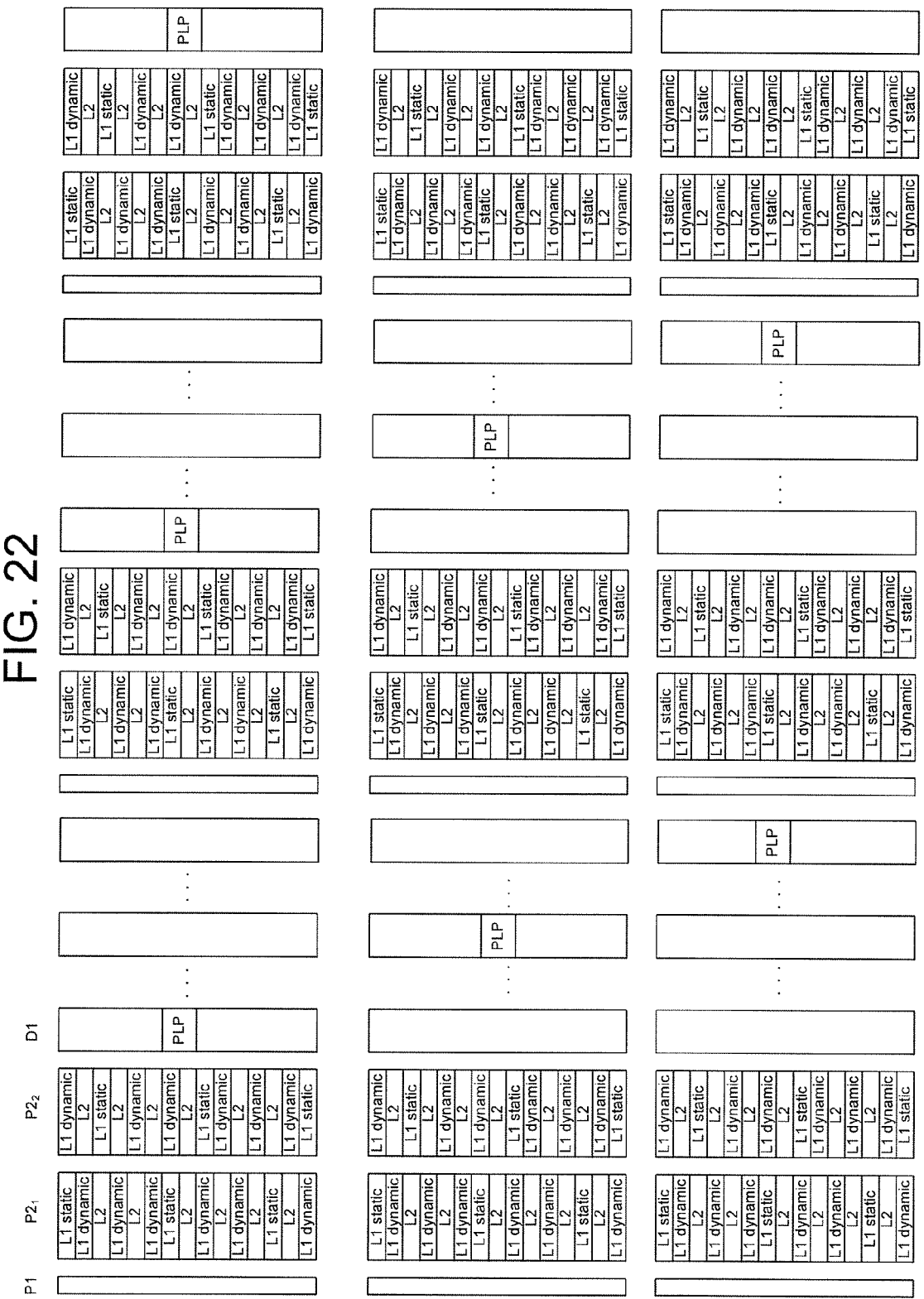

| L2 signalling (PSI/SI) | L2 signalling (PSI/SI) |
|---|---|
| Network related<br>cell_id [16b]<br>network_id [16b]<br>frequency [32b] | Service_id (){<br>Slot_id<br>Frame_loop (){<br>  frame_id<br>}<br>} |

| L1 pre-signaling | L1 signaling |
|---|---|
| CRC-8 [8b]<br>Type [8b]<br>Notification flag [1b]<br>Reserved [16b]<br><br>Signaling related<br>NUM_symbols [5b]<br>N_L1_dyn (size) [16b]<br>L1_dyn_mod [3b]<br>L1_dyn_cr [4b]<br>L1_dyn_FEC_block [1b]<br>N_L2 [18b]<br>L2_mod [3b]<br>L2_cr [4b]<br>L2_FEC_block [1b]<br>N_notif [18b]<br>Notif_mod [3b]<br>Notif_cr [4b]<br>Notif_FEC_block [1b] | CRC-8 [8b]<br><br>TFS related<br>CELL_ID [16b]<br>NETWORK_ID [16b]<br>NUM_RF [3b]<br>TFS RF loop<br>  FREQUENCY [32b]<br>end<br>GI_SIZE [4b]<br>FFT_SIZE [4b]<br>FRAME_LENGTH [10b]<br>PILOT_PATTERN [3b]<br>SIGNALLING_WINDOW_OFFSET [8b]<br>FRAME_IDX [8b]<br><br>RF_OFFSET [8b]<br>NUM_SLOT [8b]<br>For each SLOT<br>  SLOT_IDX [8b]<br>  SLOT_MODULATION [3b]<br>  SLOT_CODERATE [4b]<br>  PLP_FEC_BLOCK [1b]<br>  SLOT_START [20b]<br>  SLOT_LENGTH [20b]<br><br>end |

FIG. 30

DIGITAL BROADCAST SIGNALING METADATA

FIELD

Embodiments relate generally to communications networks. More specifically, embodiments relate to digital broadcast preamble signaling information.

BACKGROUND

Digital broadband broadcast networks enable end users to receive digital content including video, audio, data, and so forth. Using a mobile terminal, a user may receive digital content over a wireless digital broadcast network. Digital content can be transmitted in a cell within a network. A cell may represent a geographical area that may be covered by a transmitter in a communication network. A network may have multiple cells and cells may be adjacent to other cells.

A receiver device, such as a mobile terminal, may receive a program or service in a data or transport stream. The transport stream carries individual elements of the program or service such as the audio, video and data components of a program or service. Typically, the receiver device locates the different components of a particular program or service in a data stream through Program Specific Information (PSI) or Service Information (SI) embedded in the data stream. However, PSI or SI signaling may be insufficient in some wireless communications systems, such as Digital Video Broadcasting—Handheld (DVB-H) systems. Use of PSI or SI signaling in such systems may result in a sub-optimal end user experience as the PSI and SI tables carrying in PSI and SI information may have long repetition periods. In addition, PSI or SI signaling requires a large amount of bandwidth which is costly and also decreases efficiency of the system.

BRIEF SUMMARY

The following presents a simplified summary in order to provide a basic understanding of some aspects of the invention. The summary is not an extensive overview of the invention. It is neither intended to identify key or critical elements of the invention nor to delineate the scope of the invention. The following summary merely presents some concepts of the invention in a simplified form as a prelude to the more detailed description below.

Embodiments are directed to transmitting L1 pre-signaling information with predetermined modulation and code rate such that L1 pre-signaling information can be received without preliminary knowledge on the network. L1 pre-signaling information makes it possible to receive the L1 signaling information, data link layer information, and notification data that may have configurable code rates and modulation. Therefore, L1 pre-signaling information can be thought of as signaling metadata (i.e., information about other signaling information). L1 signaling is divided into pre-signaling and signaling parts. The pre-signaling part includes parameters used for receiving the L1 signaling information. L1 pre-signaling signaling enables the receiver to receive the signaling itself (L1 signaling and data link layer information) by informing the receiver about the type of modulation, coding, and the like, used to transmit the L1 signaling, data link layer, and notification information.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein:

FIG. 11 shows an example of a pilot/signaling symbol sequence in accordance with an aspect of the invention.

FIG. 12 is a flowchart showing steps of a method performed by a transmitter in accordance with at least one aspect of the invention.

FIG. 22 shows P2 symbols in frames and co-scheduled signaling in accordance with an embodiment.

FIG. 30 shows a division of L1 parameters into L1 pre-signaling parameters and L1 signaling parameters in accordance with an embodiment.

DETAILED DESCRIPTION

Figure 1:
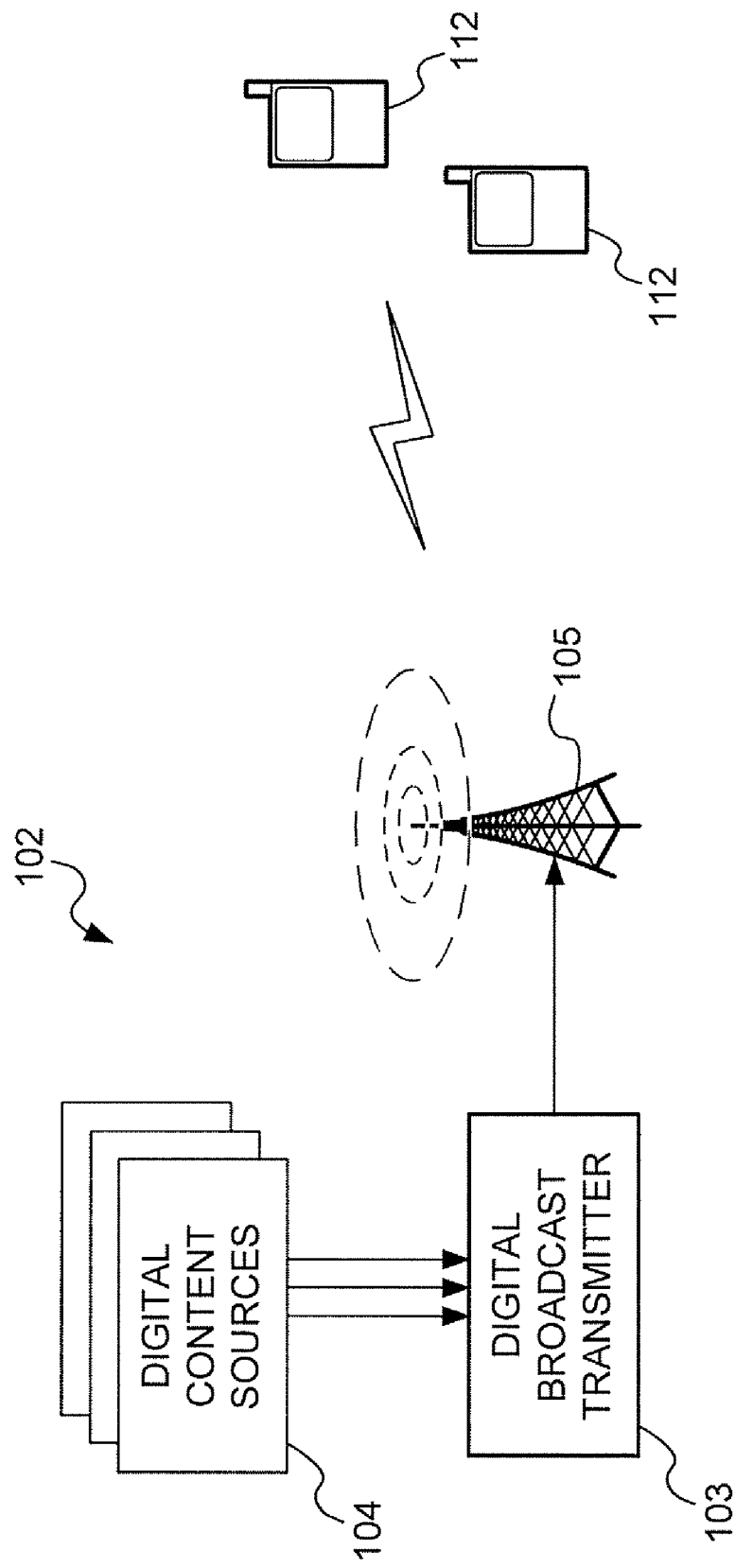
FIG. 1 illustrates a suitable digital broadband broadcast system in which one or more illustrative embodiments of the invention may be implemented.

In the following description of the various embodiments, reference is made to the accompanying drawings, which form a part hereof, and in which is shown by way of illustration various embodiments in which the invention may be practiced. It is to be understood that other embodiments may be utilized and structural and functional modifications may be made without departing from the scope and spirit of the present invention.

Embodiments are directed to service discovery and channel search in digital broadcast networks. Relatively fast service discovery is desirable from a user's point of view. Naturally, the first time receiver device is used, a blind service discovery/channel search is performed. Also, when a terminal is switched off and moved to a different location, a new blind search is also performed. Usually, a mobile TV application also runs background channel search from time to time in order to detect possible new services. The blind service discovery should only take a couple of seconds so as not to irritate the end user and to enable frequent re-scans.

The challenges related to conventional digital video broadcast service discovery include the following. The DVB-H standard offers a lot of flexibility for the signal bandwidths, FFT sizes, Guard Intervals, inner modulations and the like. Operators may use offsets for the DVB-H signal, i.e., the signal is not at the nominal center frequency of a channel, but is offset a certain amount. Different countries use different channel raster and signal bandwidth. TPS (Transmitter Parameter Signaling) is included in the standard to help receiver synchronization and channel search. Unfortunately, the receiver needs to know several parameters before it can decode TPS information. Signal bandwidth, frequency offset, FFT size, and Guard Interval need to be known before the TPS can be decoded. Most of the channels in the UHF band do not contain DVB-H service. The non-DVB-H channels are detected with a trial-and-error method (trying to achieve lock with all modes), and that consumes a lot of time. The time to detect non-DVB-H services actually mainly sets the achievable speed for channel search because usually most of the channels are empty or contain non-DVB-H service.

An example calculation for the blind service discovery is as follows: number of channels in UHF 35, (Channels 21-55, 470-750 MHz); number of frequency offsets 7 (−3/6, −2/6, −1/6, 0, +1/6, +2/6, +3/6 MHz); number of signal bandwidths 3 (6 MHz, 7 MHz, 8 MHz. 5 MHz is separate case only for USA receivers); number of FFT sizes 3 (2K, 4K, 8K); number of Guard Intervals 4 (1/32, 1/16, 1/8 and 1/4); and average time to decode TPS for one mode 120 ms (2K 50 ms, 4K 100 ms, 8K 200 ms). The numbers are exemplary.

The resulting time for blind service discovery would be in this example: 35*7*3*3*4*120 ms=1058.4 seconds=17.64 minutes.

In accordance with embodiments, various methods may be used to reduce how long it takes to perform channel search/service discovery. The basic idea of the various methods is to introduce a part of a signal (e.g. initialization/synchronization symbol(s)), which has known characteristics and remains the same with different digital video broadcast operation modes. Therefore, the known part of the signal can be decoded without having to resort to trial and error methods. The known part of signal contains the parameters for the rest of the signal; therefore, the rest of the signal can be decoded without trial and error methods after the known part is decoded. The known part of the signal comprises a subset of available subcarriers and their modulation. The combination of the predefined subcarriers (subcarrier numbers) and their modulation is chosen so that the combination is unique for each offset-FFT size pair (or unique for the different FFT-sizes only) and which combination may be used for identifying the signal as a desired signal for the digital video broadcast. Also, the channels containing digital video broadcast services can be efficiently detected using the known part of the signal. If the fixed known part is not found from the examined signal, then the signal will be considered a non-digital-video-broadcast signal or an empty channel, and the receiver can promptly proceed to a next channel/frequency. In this way, detecting non-digital-video-broadcast and empty channels becomes relatively fast.

FIG. 1 illustrates a suitable digital broadband broadcast system 102 in which one or more illustrative embodiments may be implemented. Systems such as the one illustrated here may utilize a digital broadband broadcast technology, for example Digital Video Broadcast—Handheld (DVB-H) or next generation DVB-H networks. Examples of other digital broadcast standards which digital broadband broadcast system 102 may utilize include Digital Video Broadcast—Terrestrial (DVB-T), Integrated Services Digital Broadcasting—Terrestrial (ISDB-T), Advanced Television Systems Committee (ATSC) Data Broadcast Standard, Digital Multimedia Broadcast—Terrestrial (DMB-T), Terrestrial Digital Multimedia Broadcasting (T-DMB), Satellite Digital Multimedia Broadcasting (S-DMB), Forward Link Only (FLO), Digital Audio Broadcasting (DAB), and Digital Radio Mondiale (DRM). Other digital broadcasting standards and techniques, now known or later developed, may also be used. Aspects of the invention may also be applicable to other multicarrier digital broadcast systems such as, for example, T-DAB, T/S-DMB, ISDB-T, and ATSC, proprietary systems such as Qualcomm MediaFLO/FLO, and non-traditional systems such 3GPP MBMS (Multimedia Broadcast/Multicast Services) and 3GPP2 BCMCS (Broadcast/Multicast Service).

Digital content may be created and/or provided by digital content sources 104 and may include video signals, audio signals, data, and so forth. Digital content sources 104 may provide content to digital broadcast transmitter 103 in the form of digital packets, e.g., Internet Protocol (IP) packets. A group of related IP packets sharing a certain unique IP address or other source identifier is sometimes described as an IP stream. Digital broadcast transmitter 103 may receive, process, and forward for transmission multiple digital content data streams from multiple digital content sources 104. In various embodiments, the digital content data streams may be IP streams. The processed digital content may then be passed to digital broadcast tower 105 (or other physical transmission component) for wireless transmission. Ultimately, mobile terminals or devices 112 may selectively receive and consume digital content originating from digital content sources 104.

Figure 2:
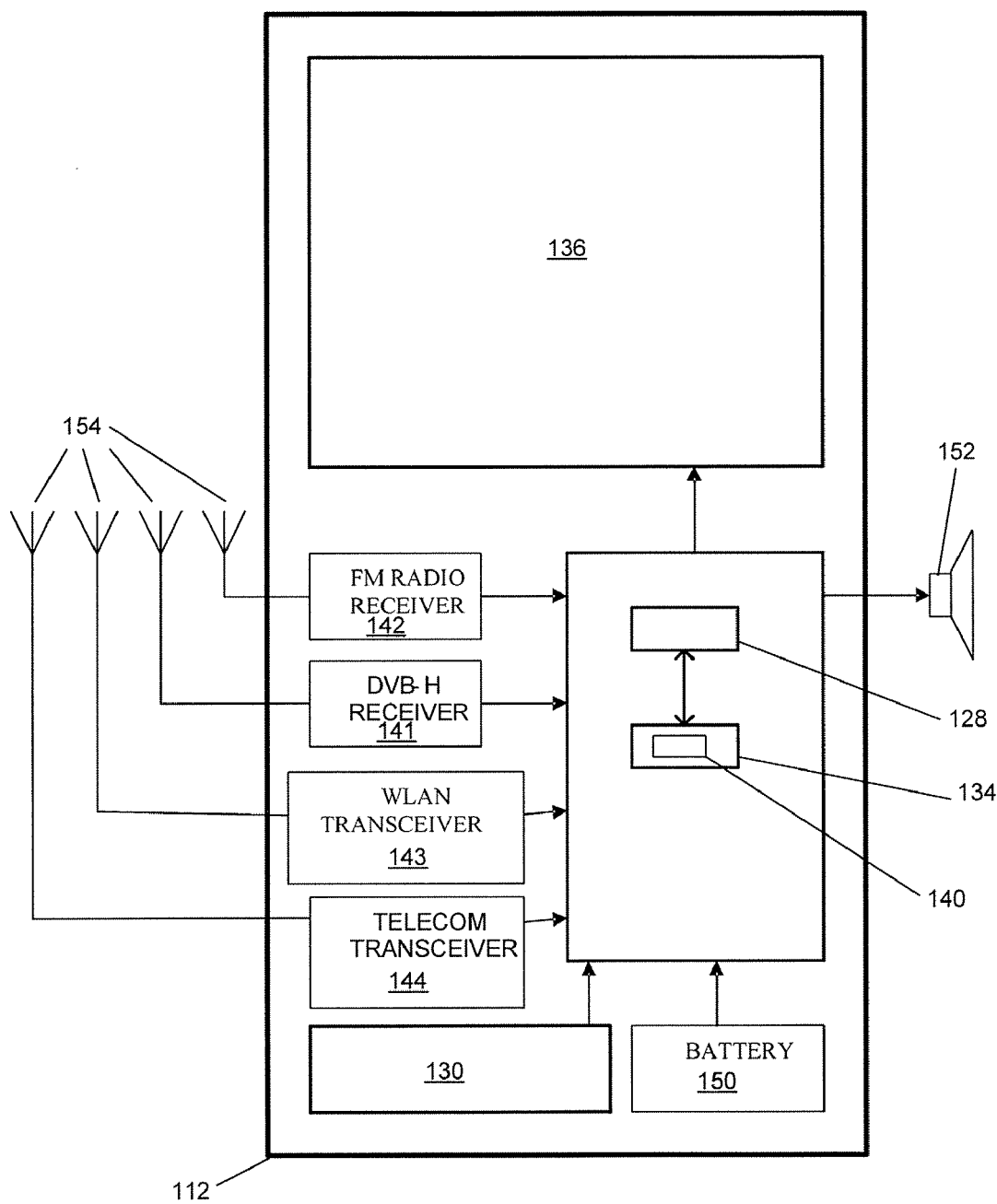
FIG. 2 illustrates an example of a mobile device in accordance with an aspect of the present invention.

As shown in FIG. 2, mobile device 112 may include processor 128 connected to user interface 130, memory 134 and/or other storage, and display 136, which may be used for displaying video content, service guide information, and the like to a mobile-device user. Mobile device 112 may also include battery 150, speaker 152 and antennas 154. User interface 130 may further include a keypad, touch screen, voice interface, one or more arrow keys, joy-stick, data glove, mouse, roller ball, touch screen, or the like.

Computer executable instructions and data used by processor 128 and other components within mobile device 112 may be stored in a computer readable memory 134. The memory may be implemented with any combination of read only memory modules or random access memory modules, optionally including both volatile and nonvolatile memory. Software 140 may be stored within memory 134 and/or storage to provide instructions to processor 128 for enabling mobile device 112 to perform various functions. Alternatively, some or all of mobile device 112 computer executable instructions may be embodied in hardware or firmware (not shown).

Mobile device 112 may be configured to receive, decode and process digital broadband broadcast transmissions that are based, for example, on the Digital Video Broadcast (DVB) standard, such as DVB-H or DVB-T, through a specific DVB receiver 141. The mobile device may also be provided with other types of receivers for digital broadband broadcast transmissions. Additionally, receiver device 112 may also be configured to receive, decode and process transmissions through FM/AM Radio receiver 142, WLAN transceiver 143, and telecommunications transceiver 144. In one aspect of the invention, mobile device 112 may receive radio data stream (RDS) messages.

In an example of the DVB standard, one DVB 10 Mbit/s transmission may have 200, 50 kbit/s audio program channels or 50, 200 kbit/s video (TV) program channels. The mobile device 112 may be configured to receive, decode, and process transmission based on the Digital Video Broadcast-Handheld (DVB-H) standard or other DVB standards, such as DVB-MHP, DVB-Satellite (DVB-S), or DVB-Terrestrial (DVB-T). Similarly, other digital transmission formats may alternatively be used to deliver content and information of availability of supplemental services, such as ATSC (Advanced Television Systems Committee), NTSC (National Television System Committee), ISDB-T (Integrated Services Digital Broadcasting—Terrestrial), DAB (Digital Audio Broadcasting), DMB (Digital Multimedia Broadcasting), FLO (Forward Link Only) or DIRECTV. Additionally, the digital transmission may be time sliced, such as in DVB-H technology. Time-slicing may reduce the average power consumption of a mobile terminal and may enable smooth and seamless handover. Time-slicing entails sending data in bursts using a higher instantaneous bit rate as compared to the bit rate required if the data were transmitted using a traditional streaming mechanism. In this case, the mobile device 112 may have one or more buffer memories for storing the decoded time sliced transmission before presentation.

In addition, an Electronic Service Guide (ESG) may be used to provide program or service related information. Generally, an Electronic Service Guide (ESG) enables a terminal to communicate what services are available to end users and how the services may be accessed. The ESG includes independently existing pieces of ESG fragments. Traditionally, ESG fragments include XML and/or binary documents, but more recently they have encompassed a vast array of items, such as for example, a SDP (Session Description Protocol) description, textual file, or an image. The ESG fragments describe one or several aspects of currently available (or future) service or broadcast program. Such aspects may include for example: free text description, schedule, geographical availability, price, purchase method, genre, and supplementary information such as preview images or clips. Audio, video and other types of data including the ESG fragments may be transmitted through a variety of types of networks according to many different protocols. For example, data can be transmitted through a collection of networks usually referred to as the "Internet" using protocols of the Internet protocol suite, such as Internet Protocol (IP) and User Datagram Protocol (UDP). Data is often transmitted through the Internet addressed to a single user. It can, however, be addressed to a group of users, commonly known as multicasting. In the case in which the data is addressed to all users it is called broadcasting.

One way of broadcasting data is to use an IP datacasting (IPDC) network. IPDC is a combination of digital broadcast and Internet Protocol. Through such an IP-based broadcasting network, one or more service providers can supply different types of IP services including on-line newspapers, radio, and television. These IP services are organized into one or more media streams in the form of audio, video and/or other types of data. To determine when and where these streams occur, users refer to an electronic service guide (ESG). One type of DVB is Digital Video Broadcasting—handheld (DVB-H). The DVB-H is designed to deliver 10 Mbps of data to a battery-powered terminal device.

DVB transport streams deliver compressed audio and video and data to a user via third party delivery networks. Moving Picture Expert Group (MPEG) is a technology by which encoded video, audio, and data within a single program is multiplexed, with other programs, into a transport stream (TS). The TS is a packetized data stream, with fixed length packets, including a header. The individual elements of a program, audio and video, are each carried within packets having an unique packet identification (PID). To enable a receiver device to locate the different elements of a particular program within the TS, Program Specific Information (PSI), which is embedded into the TS, is supplied. In addition, additional Service Information (SI), a set of tables adhering to the MPEG private section syntax, is incorporated into the TS. This enables a receiver device to correctly process the data contained within the TS.

As stated above, the ESG fragments may be transported by IPDC over a network, such as for example, DVB-H to destination devices. The DVB-H may include, for example, separate audio, video and data streams. The destination device must then again determine the ordering of the ESG fragments and assemble them into useful information.

Figure 3:
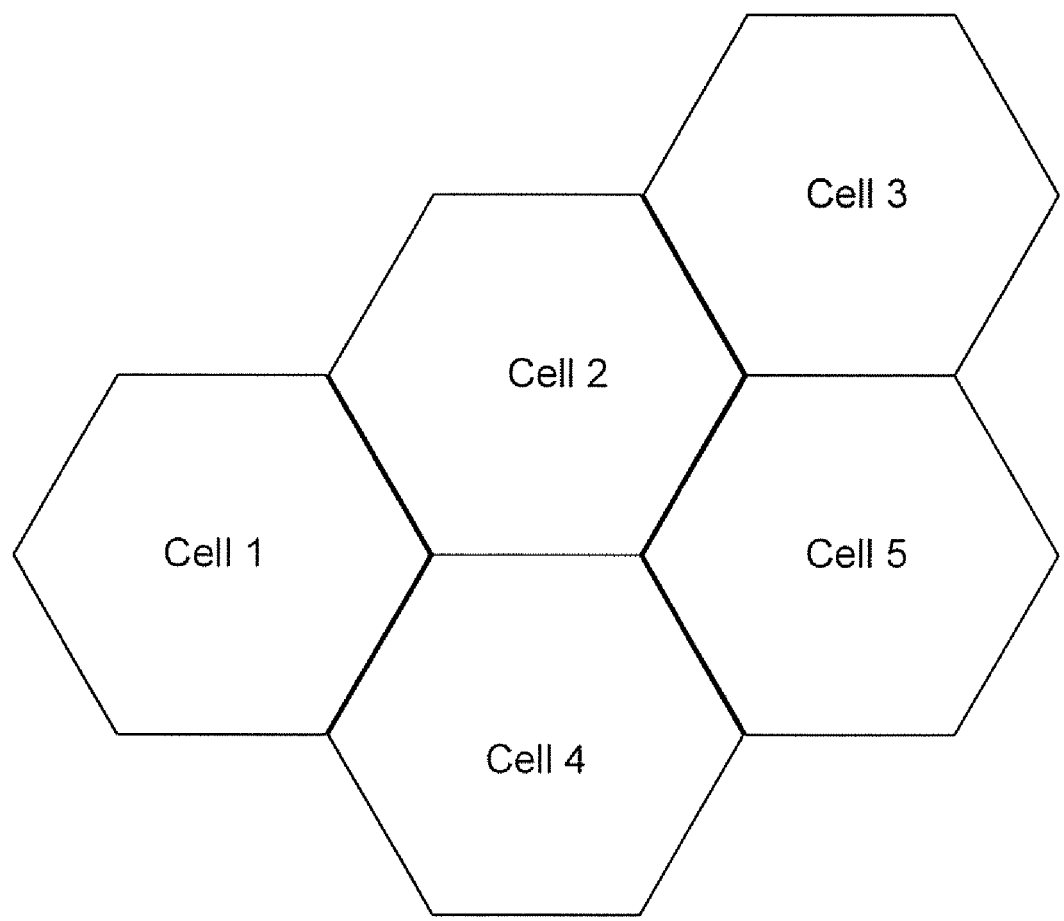
FIG. 3 illustrates an example of cells schematically, each of which may be covered by a different transmitter in accordance with an aspect of the present invention.

In a typical communication system, a cell may define a geographical area that may be covered by a transmitter. The cell may be of any size and may have neighboring cells. FIG. 3 illustrates schematically an example of cells, each of which may be covered by a different transmitter. In this example, Cell 1 represents a geographical area that is covered by a transmitter for a communication network. Cell 2 is next to Cell 1 and represents a second geographical area that may be covered by a different transmitter. Cell 2 may, for example, be a different cell within the same network as Cell 1. Alternatively, Cell 2 may be in a network different from that of Cell 1. Cells 1, 3, 4, and 5 are neighboring cells of Cell 2, in this example.

In accordance with one or more embodiments, data used in channel searches and service discovery is signaled using symbols at least in the beginning of a data frame carrying multimedia and other data for services. In other embodiments, one or more of these symbols may also be inserted within the data frames. Further, one or more of these symbols may be inserted at the beginning of, and/or within, a superframe composed of two or more data frames.

In one embodiment, the symbols comprise a first symbol that can be used for identifying that the signal is of the desired type. Further, the first symbol may be used for detecting an offset from the radio channel center frequency. The symbols may comprise a second symbol that may carry data relating to the modulation parameters that are used in subsequent data symbols. In another embodiment, the symbols comprise a third symbol that may be used for channel estimation.

Figure 4:
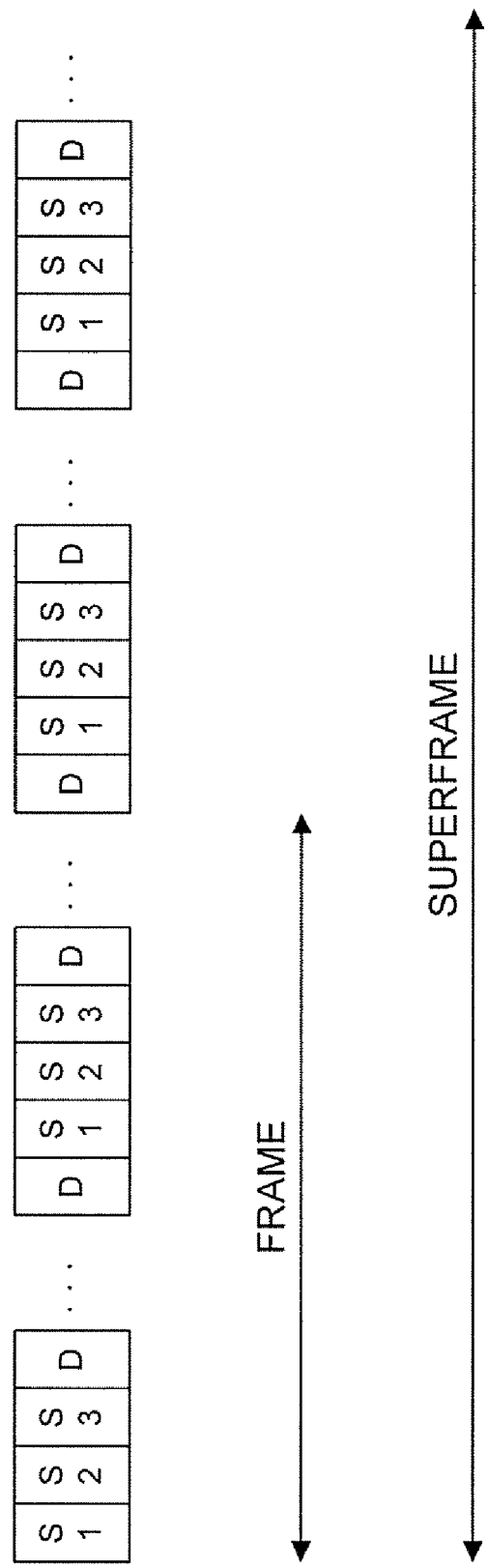
FIG. 4 shows a frame and superframe of symbols, synchronization symbols used for channel searches and service discovery, and data in accordance with an aspect of the invention.

FIG. 4 shows a frame and superframe of symbols, synchronization symbols, S1-S3, used for channel searches and service discovery, and data D in accordance with an aspect of the invention.

In various digital broadcast networks, a multicarrier signal may be positioned relative to the channel raster so that the signal center frequency (SCF) coincides with the channel center frequency (CCF), or it may be offset from the channel center frequency. The signal center frequency may be offset due to frequency spectrum use reasons (e.g. interference from a neighboring channel). For the first symbol, not all available subcarriers are used. In various embodiments, the subcarriers that are selected for the first symbol may be evenly spaced and may be symmetrically positioned with regard to the channel center frequency or the offset signal frequency.

Figure 5:
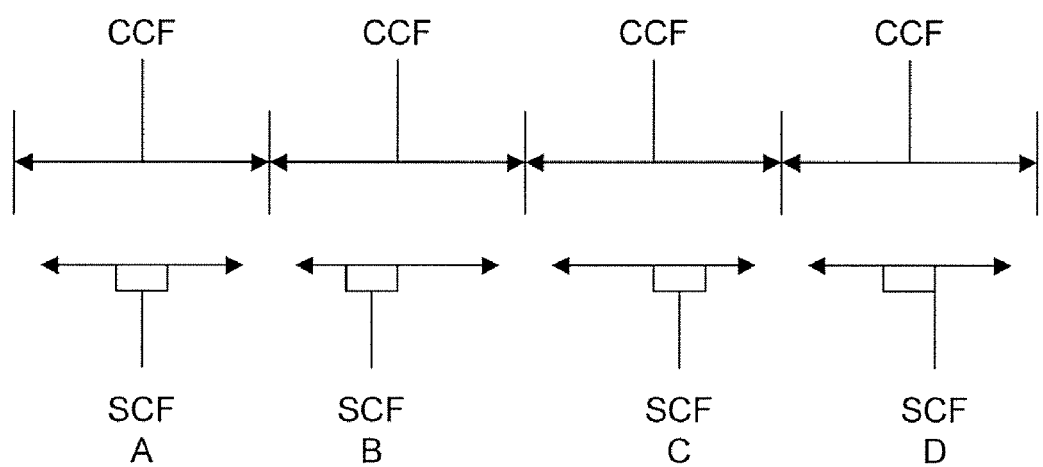
FIG. 5 shows how a signal center frequency may coincide with, or be offset relative to, a channel center frequency.

FIG. 5 shows how a signal center frequency may coincide with, or be offset relative to, a channel center frequency (CCF). In FIG. 5, SCF A and its corresponding CSF coincide, SCF B and SCF C are offset with regard to the corresponding CSFs. The rectangles in FIG. 5 illustrate the subcarriers selected for the first symbol from the available subcarriers. For SCF A, SCF B, and SCF C, the selected subcarriers are centered around the respective SCFs. The selected subcarriers for SCF D, however, are centered around the CCF, as opposed to the SCF.

For the first symbol used for channel searches and service discovery, the subcarriers may be selected so that they may be found irrespective of the offset. In the first symbol, a fixed Fast Fourier Transform (FFT) may be used. The fixed FFT may be selected from the available FFT sizes that in present digital video broadcast systems include 2K, 4K, 8K, but may also include 1K at the lower end and 16K at the higher end. In one embodiment, the lowest available FFT is used. Further, the first symbol may use a fixed guard interval (GI) that may be selected from the GIs used for the symbols carrying data. The first symbol may, in one embodiment, have no guard interval.

The number of subcarriers for the first symbol may be less than half of the available subcarriers.

When the first symbol is used for channel offset signaling, the carriers may be modulated using Binary Phase Shift Keying (BPSK) or Quadrature Phase Shift Keying (QPSK). The selected pilot pattern may be different for different channel offset values, and the pilot pattern and subcarrier modulation may be selected, in one embodiment, so that the different pilot patterns are orthogonal to each other and differ from each other maximally thus allowing robustness in detection. In one embodiment the different pilot patterns may signal the FFT-size only and the frequency offset is found by detecting the shift from the nominal center frequency.

For the second (and third, if present) symbol the full signal bandwidth (substantially all available carriers) may be used. In an embodiment, the second (and third) symbol may use the same FFT size and guard interval as the first symbol. In some embodiments, not all of the available subcarriers are used for the second (and third) symbols. In one embodiment, the second and third symbol may have the same subcarriers as pilot subcarriers and, in a further embodiment, have additional subcarriers used as pilots. In one embodiment, the second symbol also carries signaling data and, further, may carry forward error correction data (FEC) for the signaling data.

In accordance with embodiments, a part of a signal (e.g. initialization/synchronization symbol(s)) is introduced that has known characteristics and remains the same with different digital video broadcast operation modes. The known part of signal contains parameters for the rest of the signal; therefore, the rest of the signal can be decoded without trial and error methods after the known part is decoded. Also, the channels containing digital video broadcast services can be efficiently detected using the known part of the signal. If the fixed known part is not found from the examined signal, then the signal will be considered a non-digital-video-broadcast signal or an empty channel, and the receiver can promptly proceed to a next channel/frequency.

Figure 6:
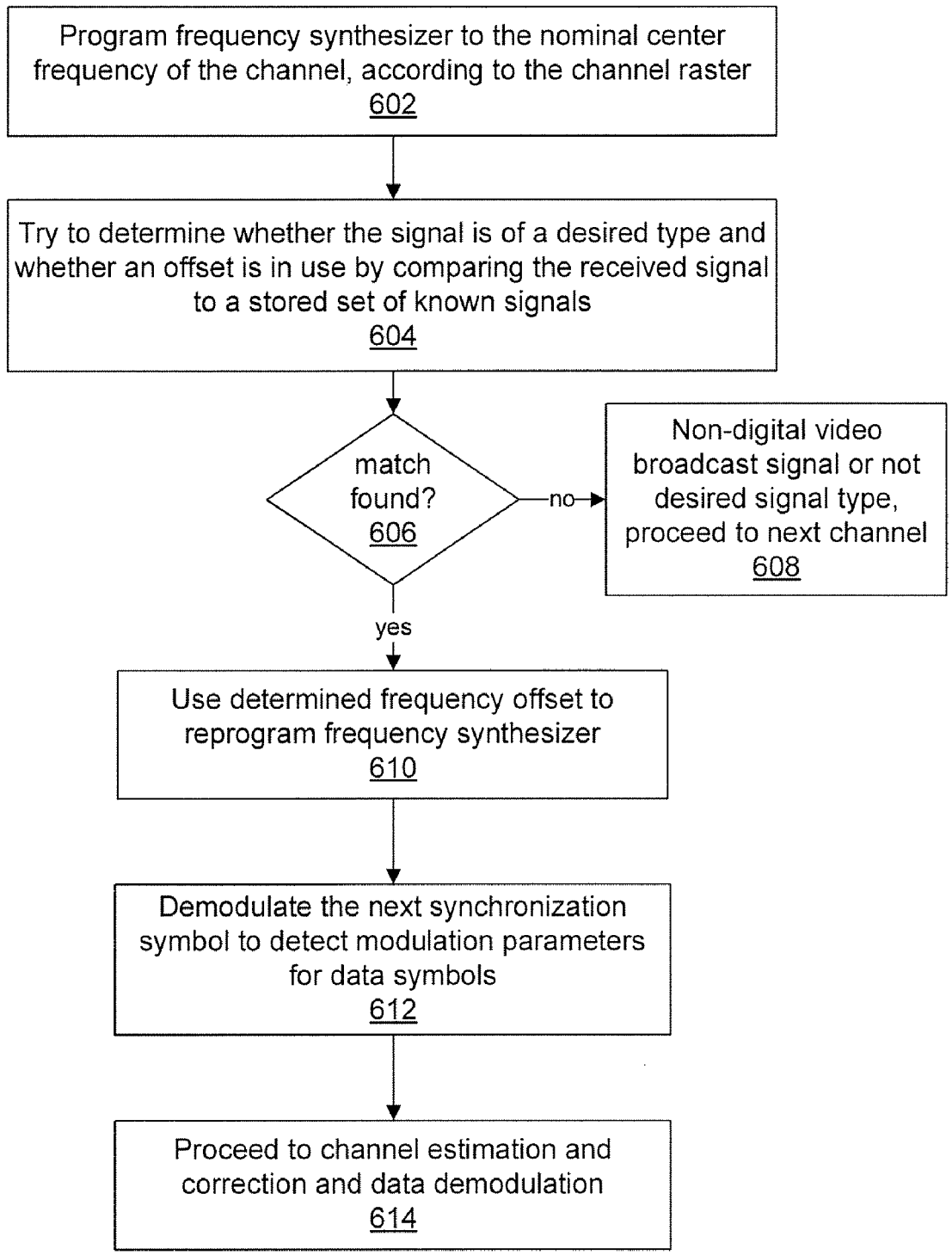
FIG. 6 is a flow chart showing steps performed by a receiver in accordance with at least one embodiment.

FIG. 6 is a flow chart showing steps performed by a receiver in accordance with at least one embodiment. A frequency synthesizer in the receiver is programmed to the nominal center frequency of the channel, according to the channel raster, as shown at 602 for receiving a signal on the channel. An attempt is made to determine whether the received signal is of a desired type and whether an offset is in use by comparing the received signal to a stored set of known signals, as shown at 604. If a match is found, the signal is determined to be of the desired type and the offset and FFT size for the signal can be determined. A determination is made with respect to whether a match was detected, as shown at 606. If a match is not detected, then the "no" branch from 606 is followed, the channel is considered to contain a non-digital-video-broadcast signal or the received signal is not of the desired type, and processing proceeds to the next channel, as shown at 608.

Otherwise, if a match is detected, then the "yes" branch from 606 is followed, the determined frequency offset is used for reprogramming the frequency synthesizer, as shown at 610. The next synchronization symbol is demodulated to detect modulation parameters for data symbols, as shown at 612. Finally, channel estimation and correction and data demodulation are then performed, as shown at 614.

In case the reprogramming of the frequency synthesizer takes a relatively long time, the receiver may wait for the next set of initialization/synchronization symbols and demodulate the modulation parameters from that set.

Figure 7:
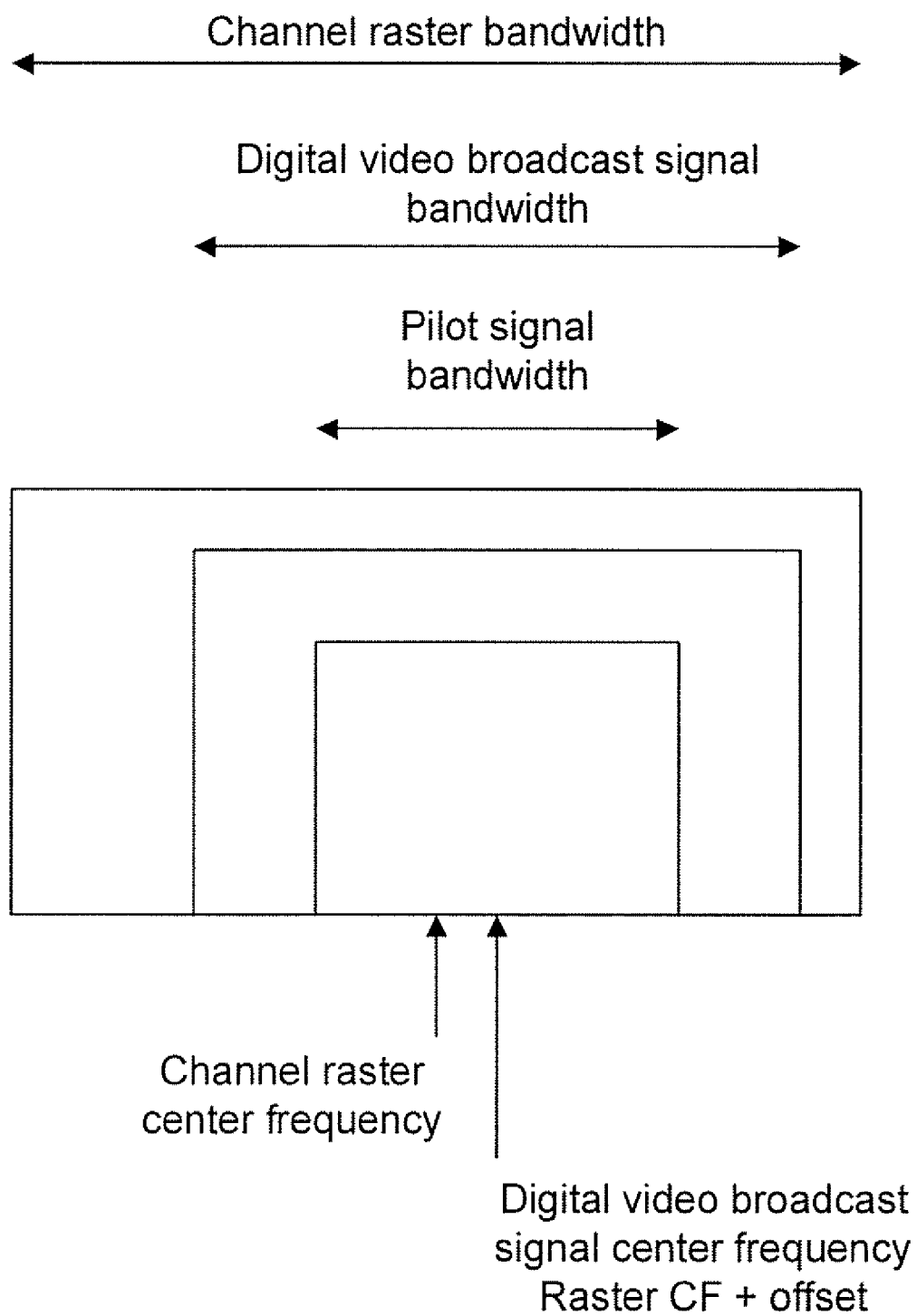
FIG. 7 shows an example of the size of a pilot signal bandwidth relative to a signal bandwidth and a channel raster bandwidth in accordance with an aspect of the invention.

FIG. 7 shows an example of the size of a pilot signal bandwidth relative to a signal bandwidth and a channel raster bandwidth in accordance with an aspect of the invention. In an embodiment, the first symbol is a pilot symbol for coarse frequency and timing synchronization. The bandwidth of the pilot symbol is smaller than the actual data symbol, e.g. in 8 MHz data symbol case, the pilot symbol could be 7 MHz wide. The pilot symbol center frequency may be the same as the frequency for the data symbols, i.e., in case an offset is used for data symbols, the offset may also be used for the pilot symbol. With the pilot symbol's smaller bandwidth, the receiver's radio frequency (RF) part can be programmed to the nominal channel center frequency during the initial synchronization phase and still be set to receive the pilot symbol's whole bandwidth. Without the pilot symbol's smaller bandwidth, the receiver's RF channel selection filter would filter out part of the pilot symbol.

In an embodiment, the pilot symbol may use known (fixed) FFT and Guard Interval selection. Also the number of used pilots may be different than for data symbols, i.e., part of the pilots can be extinguished, e.g., 256 pilots could be used. The pilots may be modulated with a known sequence.

Figure 8:
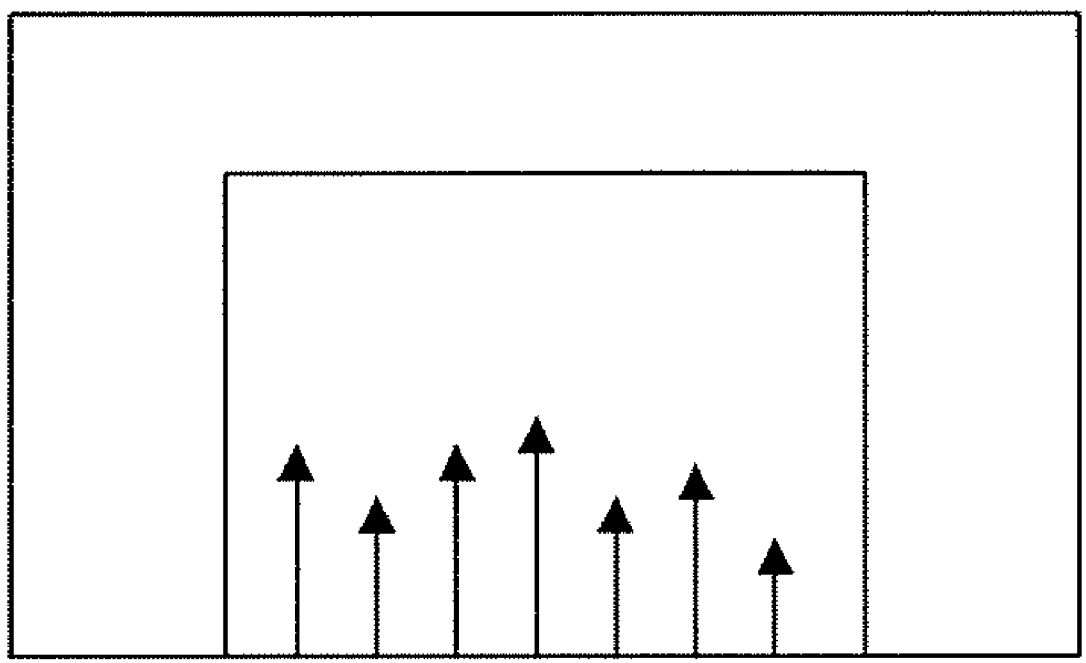
FIG. 8 illustrates sparse pilot spacing of a pilot sequence for a pilot symbol in accordance with an aspect of the invention.

FIG. 8 illustrates sparse pilot spacing of a pilot sequence for a pilot symbol in accordance with an aspect of the invention. The modulation sequence "finger print" for the pilot pattern may be known by the receiver. In addition to modulation, the subcarriers in the pilot symbols may also have different boosting levels, as illustrated in FIG. 8.

Figure 9:
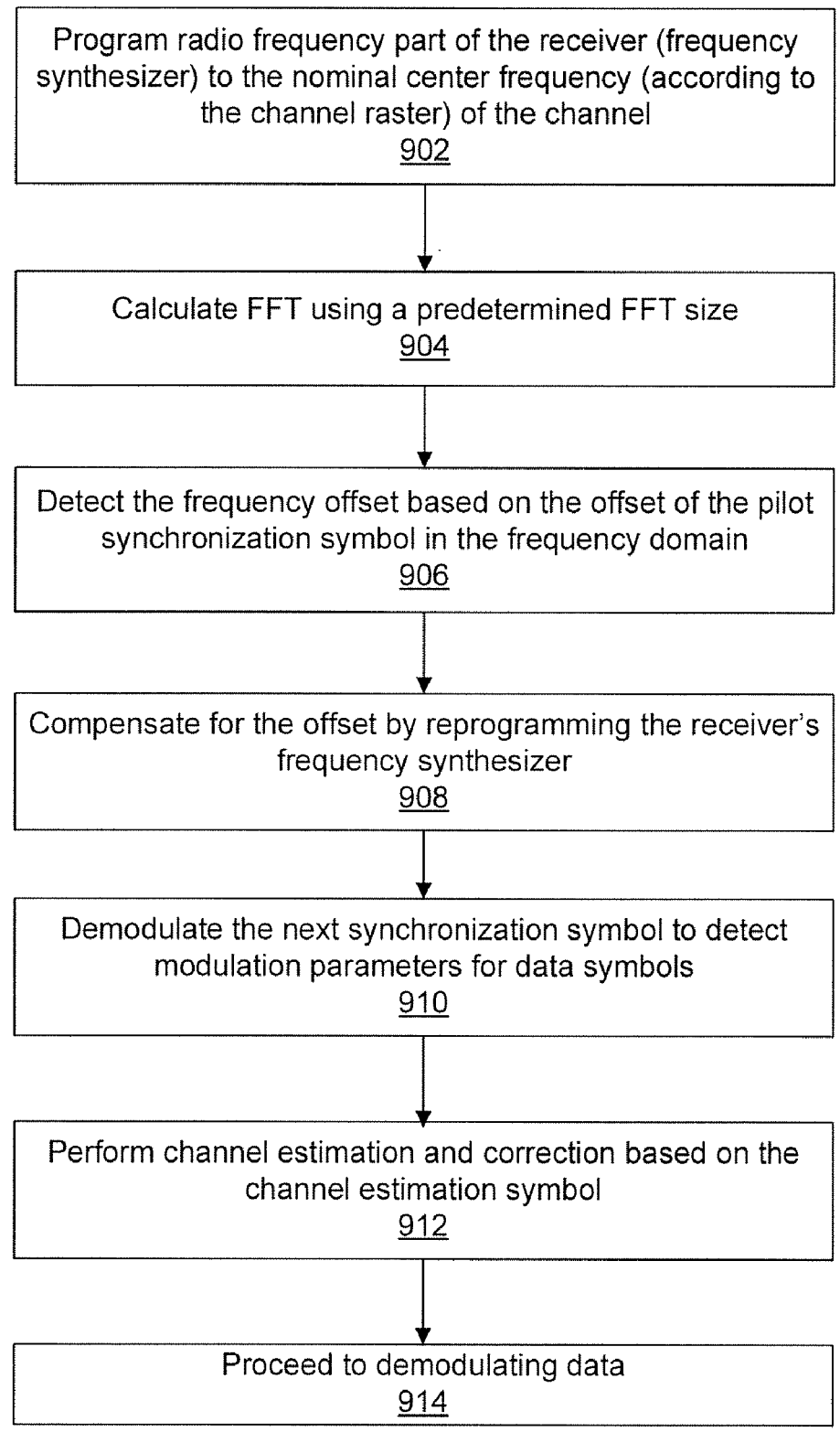
FIG. 9 is a flowchart showing steps performed by a receiver for performing correlation in the frequency domain to detect the coarse offset being used.

FIG. 9 is a flowchart showing steps performed by a receiver for performing correlation in the frequency domain to detect the coarse offset being used. A radio frequency part of the receiver (frequency synthesizer) is programmed to the nominal center frequency (according to the channel raster) of the channel, as shown at 902.

An FFT is calculated using a predetermined FFT size as shown at 904. The width of the pilot symbol is smaller than the channel bandwidth. Therefore, the FFT is able to capture the pilot symbol even when an initial setting for frequency synthesizer is wrong because of the offset.

The frequency offset is detected based on the offset of the pilot synchronization symbol in the frequency domain, as shown at 906. If non-correlation in the frequency domain is found, then the signal is not a digital video broadcast signal and channel search can proceed to the next channel.

The offset is compensated for by reprogramming the receiver's frequency synthesizer, as shown at 908. The next synchronization symbol is demodulated to detect modulation parameters for data symbols, as shown at 910. Channel estimation and correction based on the channel estimation symbol is performed, as shown at 912, and then data is demodulated as shown at 914. In an embodiment the receiver may wait for a synchronization symbol in the next set of synchronization symbols thus allowing the frequency synthesizer to be reprogrammed to the signal center frequency.

Different pilot sequences (finger prints) may be used based on the offset in use. For example, if 7 offsets are possible (±3/6 MHz, ±2/6 MHz, ±1/6 MHz, 0), 7 different pilot sequences may be introduced. Several methods can be utilized to construct the pilot sequence including, but not limited to: pseudo random sequence, inverting every second, boosting the center carrier, and the like. In accordance with an embodiment, the receiver performs a correlation in the time domain to detect the used pilot sequence, and, therefore, the offset used. The finger prints may be used in accordance with one or more embodiments directed to performing a time domain correlation. But, frequency domain embodiments, the offset can be detected by a sliding correlator in the frequency domain, that is, a single finger print may be used. Additionally, one could code information like FFT size for frequency domain embodiments if different finger prints are used for different FFT sizes, for example. Then, a frequency domain correlation could be run with several finger prints. In an embodiment, if there are several finger prints in use, the received fingerprint may be compared simultaneously to several stored finger prints. A received pilot sequence may be translated in frequency domain stepwise over the channel bandwidth, wherein a high correlation signal is produced when the pilot sequences coincide.

Figure 10:
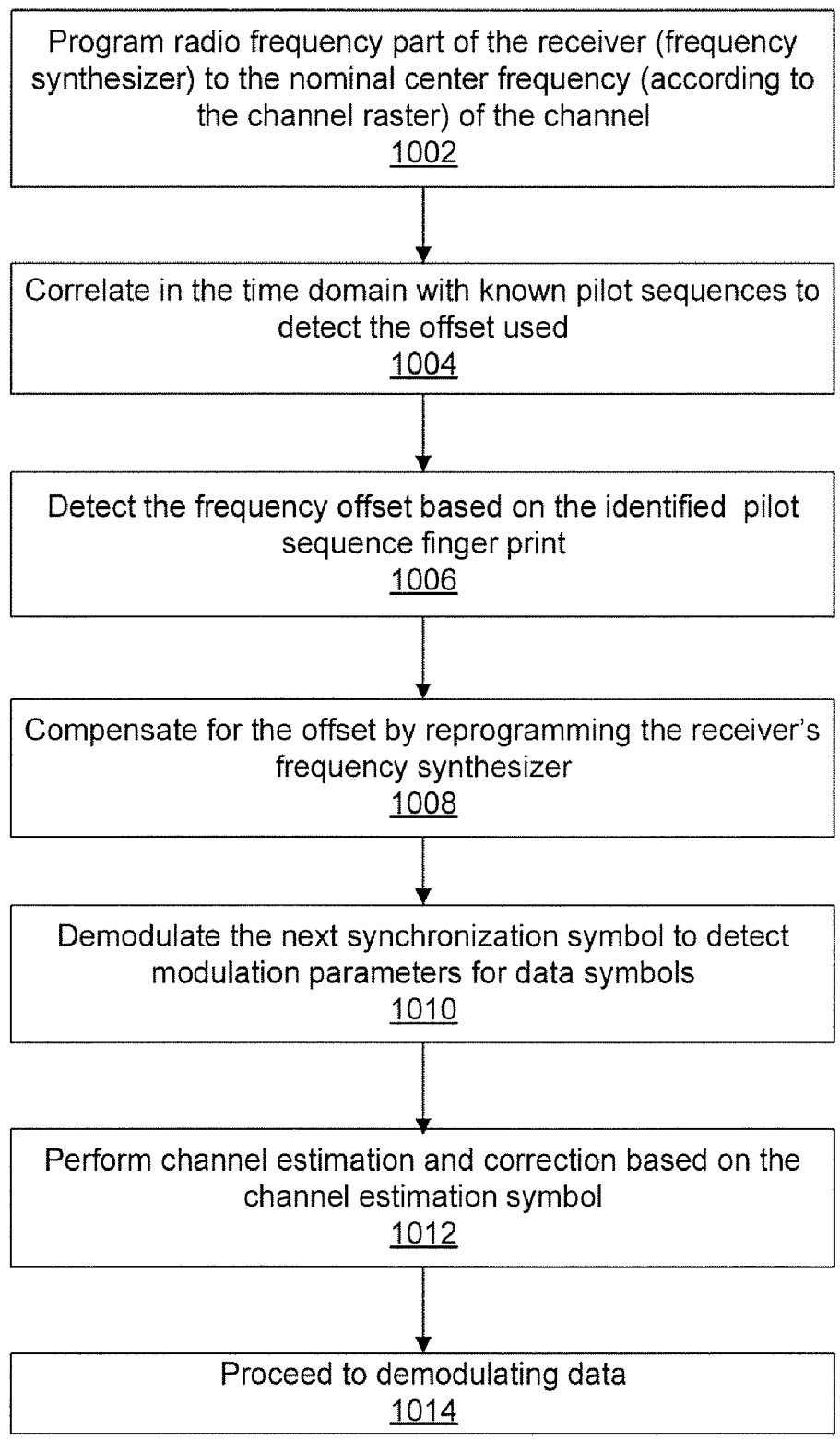
FIG. 10 is a flow chart that shows steps in accordance with an embodiment for performing a service discovery correlation in the time domain.

FIG. 10 is a flow chart that shows steps in accordance with an embodiment for performing a service discovery correlation in the time domain. A radio frequency part of the receiver (frequency synthesizer) is programmed to the nominal center frequency (according to the channel raster) of the channel, as shown at 1002.

In one embodiment a correlation of the received pilot sequence is performed in the time domain with known pilot sequences to detect the offset used, as shown at 1004. For examples, if seven offsets are in use, seven different pilot sequences (finger prints) are defined. Each coarse offset corresponds to a particular pilot sequence finger print. Based on the correlation, the finger print used, i.e., the offset used, can be detected. The pilot sequence will be in the nominal center frequency of the channel (according to the channel raster). In one embodiment a set of pilot symbols are defined so that each of them corresponds to a frequency offset-FFT size pair, wherein based on the detected correlation both the offset and FFT size can be detected.

The frequency offset is detected based on the identified pilot sequence finger print, as shown at 1006. If none of the pilot sequences show correlation, then the signal is not a desired digital video broadcast signal, and search can proceed to the next channel.

The offset is compensated for by reprogramming the receiver's frequency synthesizer, as shown at 1008. The next synchronization symbol is demodulated to detect modulation parameters for data symbols, as shown at 1010. Channel estimation and correction based on the channel estimation symbol is performed, as shown at 1012, and then data is demodulated as shown at 1014. In one embodiment the receiver may wait for a next set of synchronization symbols for allowing the frequency synthesizer to be reprogrammed.

After the offset has been found and the frequency synthesizer is reprogrammed, the second symbol (i.e., the symbol following the pilot symbol) may use fixed FFT and Guard Interval selection, but would use the full signal bandwidth. The second symbol may then contain specific information about the modulation parameters for the subsequent data symbols. In another embodiment the second symbol may use the FFT that is signaled in the first symbol.

An optional third symbol could be inserted before the data symbols to facilitate channel estimation.

FIG. 11 shows an example of a pilot/signaling symbol sequence in accordance with an aspect of the invention. The pilot symbol 1102 and the Signaling Symbols 1104 and 1106 may be repeated in the transmission frequently enough, e.g., every 50 ms, to enable signal detection and synchronization as fast as is desired. The first pilot symbol 1102 is used for coarse frequency and time synchronization, and, in addition, it may also carry information on the FFT size for the following symbols. The FFT, guard interval, and the modulation are fixed for the first symbol. In one embodiment the second symbol 1104 comprises the same pilot subcarrier as the first symbol but may have, in addition, more subcarriers that are used as pilot subcarriers. The second signaling symbol also carries signaling data comprising FFT size, guard interval, and modulation parameters. The third signaling symbol comprises still more pilots that are used for channel estimation and fine timing.

The modulation parameter for data symbols (like constellation, QPSK vs. 16QAM vs. 64QAM) may be varied frequently because the repeated signaling symbols carry information about the selected parameters.

FIG. 12 is a flowchart showing steps of a method performed by a transmitter in accordance with at least one aspect of the invention. A symbol sequence is composed that includes a pilot symbol configured to convey coarse frequency and timing synchronization information as the first symbol followed by a next signaling symbol configured to convey modulation parameters as the second symbol, which is followed by a plurality of data symbols, as shown at 1202. In one embodiment the second signaling symbol may be followed by a third signaling symbol. The symbol sequence is then transmitted on a broadcast channel with a pilot-signal bandwidth that may be narrower than a data-signal bandwidth, which further may be narrower than a channel raster bandwidth of the broadcast channel, as shown at 2004.

In accordance with one or more embodiments, channel search times are typically relatively low, e.g., a couple of seconds. If the pilot-symbol repetition rate is 50 ms, the average time for 3 bandwidths (6, 7 and 8 MHz) is around 35*3*50 ms=5.25 s. The different bandwidths are searched separately because the channel raster center frequencies are different.

In yet another embodiment of the invention, two pilot symbols, P1 and P2, respectively are defined to enable fast channel search and service discovery within the frame. Furthermore, for the carriage of OSI layer 1, physical layer (L1) and frame specific information within the P2 symbol, a P2-1 packet structure is defined. In addition to the L1 and frame specific information, the P2-1 packet may also carry OSI layer 2, data link layer (L2) signaling information (e.g. Program Specific Information/Service information (PSI/SI)) or data of the actual services.

In an aspect of the invention, pilot symbol P1 may enable a fast initial scan for signals. Pilot symbol P1 may also be used to signal FFT-size and frequency offset to a receiver in the initial signal scan. In addition, pilot symbol P1 may be used to assist in coarse frequency and coarse time synchronization of the receiver.

In yet another aspect of the invention, pilot symbol P2 may be used for coarse and fine frequency synchronization and time synchronization in addition to initial synchronization achieved with pilot symbol P1. Moreover, pilot symbol P2 may also carry physical layer (L1) signaling information which may describe the physical parameters of the transmission and the construction of the TFS-frame. Furthermore, pilot symbol P2 may provide an initial channel estimate, which may be needed to decode information in the P2 symbol and together with scattered pilots, the information in the first data symbols in the frame. Finally, pilot symbol P2 may provide a channel for carrying Layer 2 (L2) signaling information.

In an embodiment of the invention, two P2 packets structures may be implemented for carrying signal information. The first of such packets P2-1 may carry main signaling information needed in time frequency slicing (TFS). The P2-1 packet structure may also carry L2 signaling information and/or data. In another embodiment of the invention, a second packet structure P2-n may be used to provide sufficient space to encapsulate all needed L2 signaling information. The P2-n packets may be carried in data symbols as content data. The P2-n packets may follow immediately the P2-1 packet.

Figure 13:
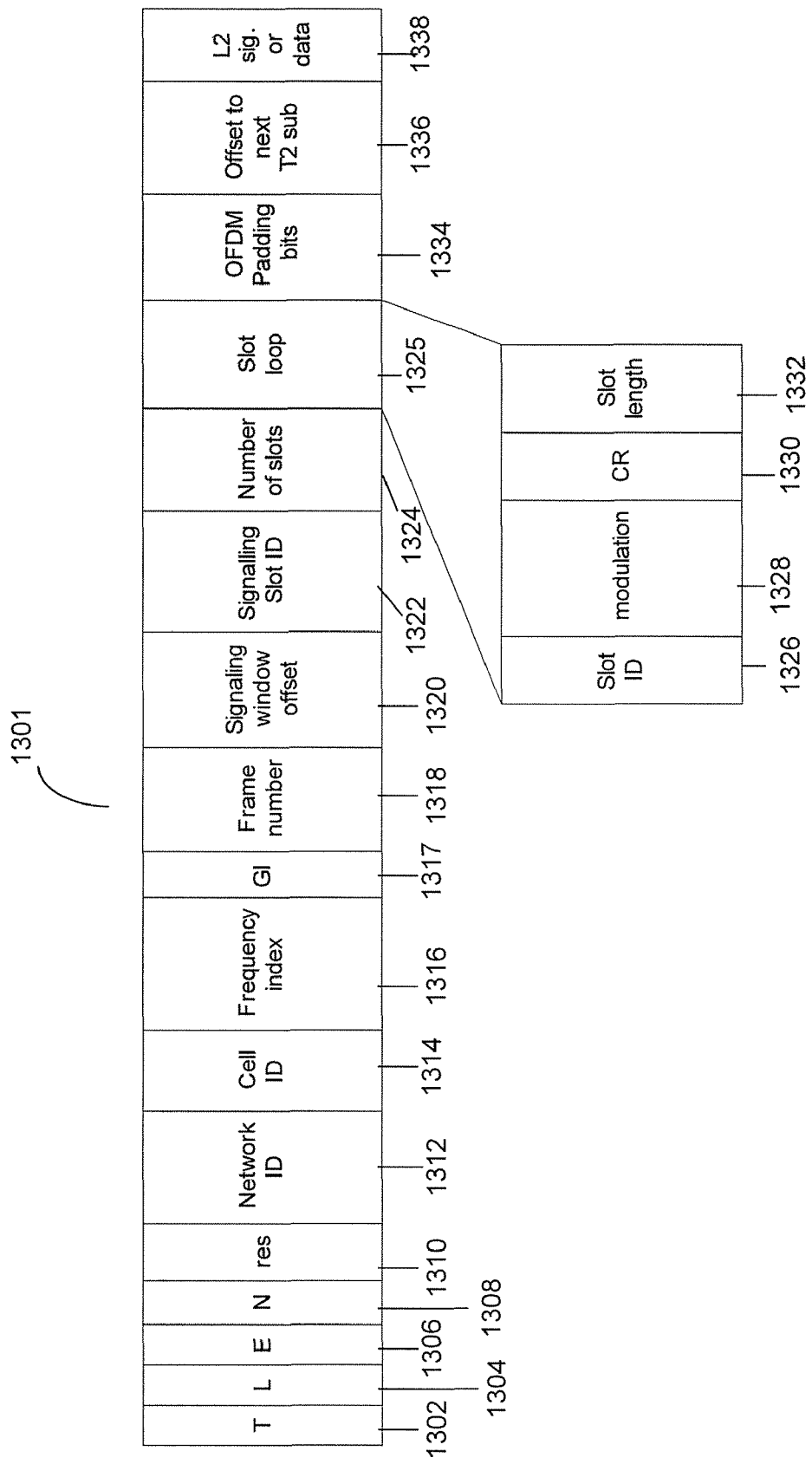
FIG. 13 illustrates a packet structure in accordance with an aspect of the invention.

FIG. 13 illustrates the structure of such P2-1 packet structure 1301. The definition of the fields, the lengths being exemplary for various embodiments, in P2-1 are as follows:

T (Type) This 8 bit field 1302 may indicate the type of the related P2 symbol. This field may provide flexibility for the network to transmit different P2 symbols. Based on the type value, certain rules and semantics apply to the P2 symbol structure and usage. Examples of the latter are e.g. the affect of the different output stream types supported by the system (i.e. different combinations of TS and Generic Stream Encapsulation (GSE)). Some examples of the type value may be seen in Table 1 illustrated below.

TABLE 1

The type values of the P2-1 packet.

| Type value | Description |
| --- | --- |
| 0x0 | Reserved |
| 0x1 | Only TS carried within the frame and L2 signaling carried in the end of P2-1 packet. |
| 0x2 | Only TS carried within the frame and data carried in the end of P2-1 packet. |
| 0x3 | Only GSE carried within the frame and L2 signaling carried in the end of P2-1 packet. |
| 0x4 | Only GSE carried within the frame and data carried in the end of P2-1 packet. |
| 0x5 | TS and GSE carried within the frame |
| 0x6 | DVB-T2 and DVB-H2 content carried within the same frame. |
| 0x7 | Etc. |

One skilled in the art will realize, that the notations DVB-T2 or T2 and DVB-H2 or H2 shown in Table 1 may be used for content intended for terrestrial (fixed) reception, respectively for mobile handheld reception using various embodiments of the invention.

L (Length) This field 1304 may indicate the length of the P2-1 packet, counting all bits following immediately after this field. The length may be expressed as number of bits or bytes depending on the definition.

E (End) This field 1306 comprises a one bit flag which indicates whether there are other P2-n packets following this. When set to value '1', there does not exist any P2-n packets after this packet. If this field is set to value '0', there are one or more P2-n packets following after this field.

N (Notification) This 4 bit field 1308 may indicate whether there are notifications carried within the current sub-signal. The detailed signaling of notifications may be done within L2 signaling structures.

res This 4 bit field 1310 may be reserved for the future use.

Cell ID This 8 bit field 1312 may indicate the cell_id of the signal carrying the current frame. The mapping between cell_id and other network parameters is done within the L2 signaling. Note that in order to reduce overhead, this field may be smaller than that of used within legacy DVB systems.

Network ID This 8 bit field 1314 may indicate the network_id that the signal carrying the current frame belongs into. The mapping between network_id and other network parameters is done within the L2 signaling. Note that in order to reduce overhead, this field may be smaller than that of used within legacy DVB systems.

Frequency index This field 1316 may indicate the frequency index of the current sub-signal. Frequency index can be mapped with the actual frequency e.g. in L2 signaling information (e.g. in PSI/SI). Table 2 lists an example of the latter mapping. In this example, four frequencies are used, but the number may be smaller or greater in other embodiments.

| Frequency index | Frequency |
| --- | --- |
| 0x0 | 498 MHz |
| 0x1 | 506 MHz |
| 0x2 | 514 MHz |
| 0x3 | 522 MHz |

GI This field 1317 may indicate the Guard Interval.

Frame number This 8 bit field 1318 may indicate the number of the current frame in a superframe.

Figure 14:
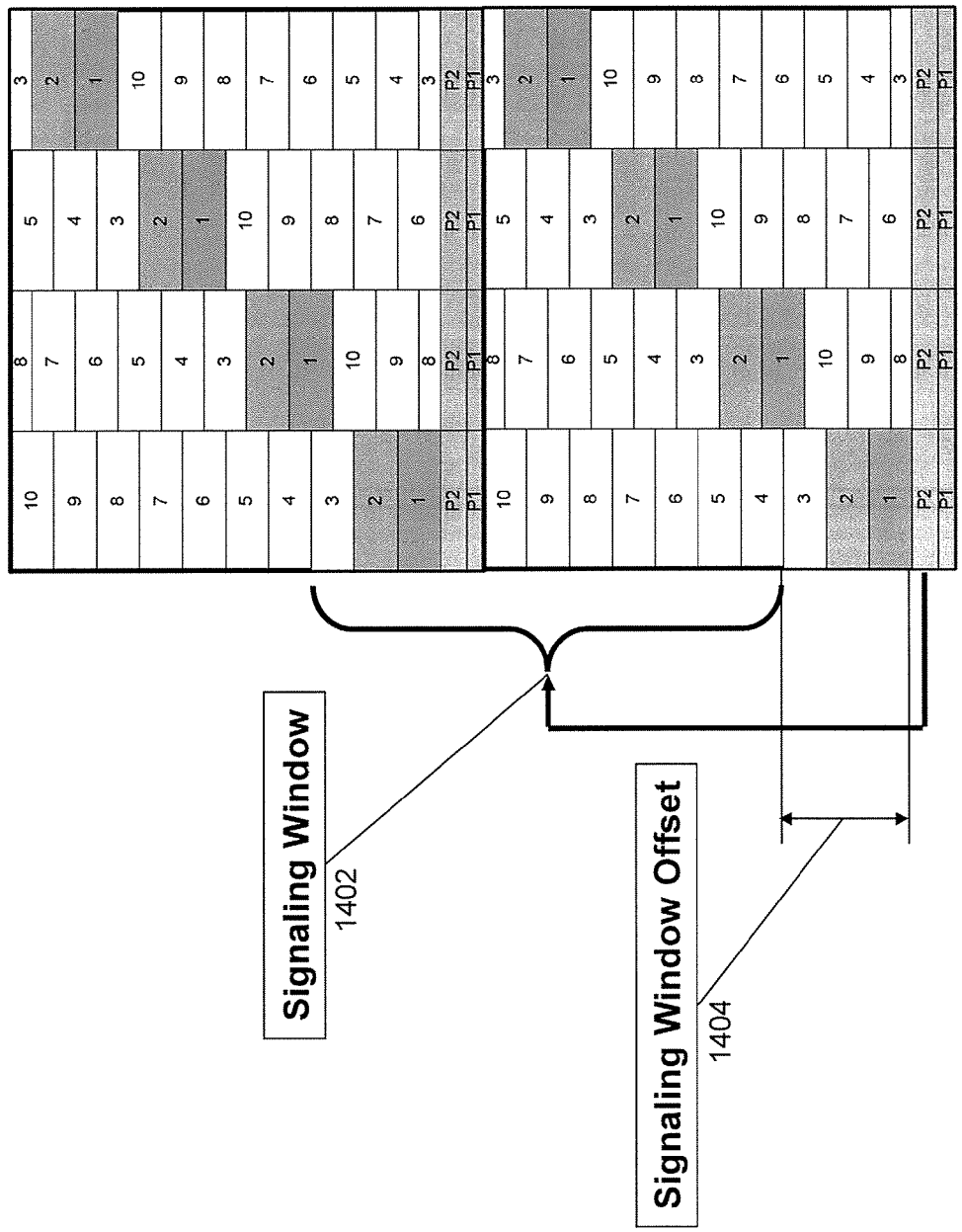
FIG. 14 illustrates a signaling window offset in accordance with an aspect of the invention.

Signaling window offset This 8 bit field 1320 may indicate the starting point for the (slot) signaling provided within this P2 symbol. The offset from the beginning of the frame within the current sub-signal is indicated as amount of OFDM cells. The total length of slots covered by the signaling window is equal to the length of slots within the current frame and sub-signal. For example, FIG. 14 illustrates the concept of signaling window offset. In FIG. 14, a signaling window 1402 may have a length of approximately one frame, but may not be starting from the first slot of the frame. The offset 1404 may define the starting point of the carried signaling within the TFS-frame. If the offset is zero, the window may be pointing directly to the current frame, and all services in the frame are signalled. If the offset is one frame, the window may be pointing to the next frame. If the offset is smaller than one frame, the signaling may start from a service pointed by the signaling offset and approximately a number of the services corresponding to one frame in length may be signalled.

Signaling slot ID This field 1322 may identify the slot which carries the P1 and P2 signaling data. Note that same slot ID may also carry other data, such as L2 signaling or data containing actual services.

Number of slots This 8 bit field 1324 may indicate the number of slots included within the signaling window of the current sub-signal.

Slot ID This field 1326 which may be part of a slot loop field 1325 may identify a slot within the signaling window of the current sub-signal. A slot identified with this identifier may carry data containing actual services or L2 signaling data.

Modulation This field 1328 which may be part of slot loop field 1325 may indicate the type of modulation of the associated slot.

Code rate This field 1330 which may be part of slot loop field 1325 may indicate the code rate of the associated slot.

Slot length This field 1332 which may be part of slot loop field 1325 may indicate the length of the associated slot. The length may be expressed as number of bits or bytes depending on the definition.

OFDM padding bits This 8 bit field 1334 may indicate the number of padding bits within the last OFDM cell of the frame.

Figure 15:
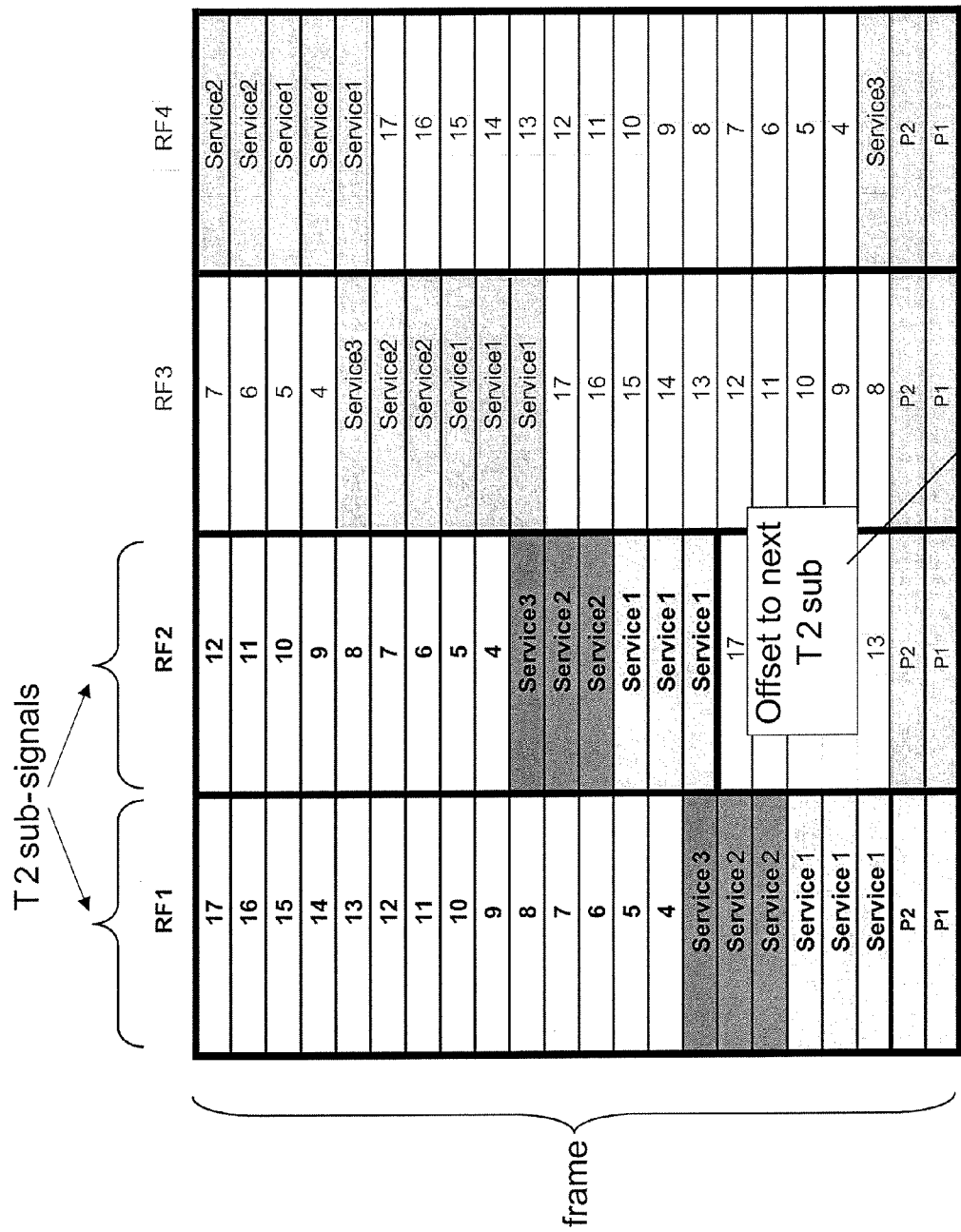
FIG. 15 illustrates an offset between a current and next sub-signal of a frame in accordance with an aspect of the invention.

Offset to next T2 sub This 4 bit field 1336 may indicate the offset between the current and the next sub-signal of the frame. For example, FIG. 15 illustrates the offset 1502 to the next sub-signal field.

L2 signaling or data This field 1338 may be reserved for carrying L2 signaling or data. The type field of P2-1 may indicate the information carried within the field.

Figure 16:
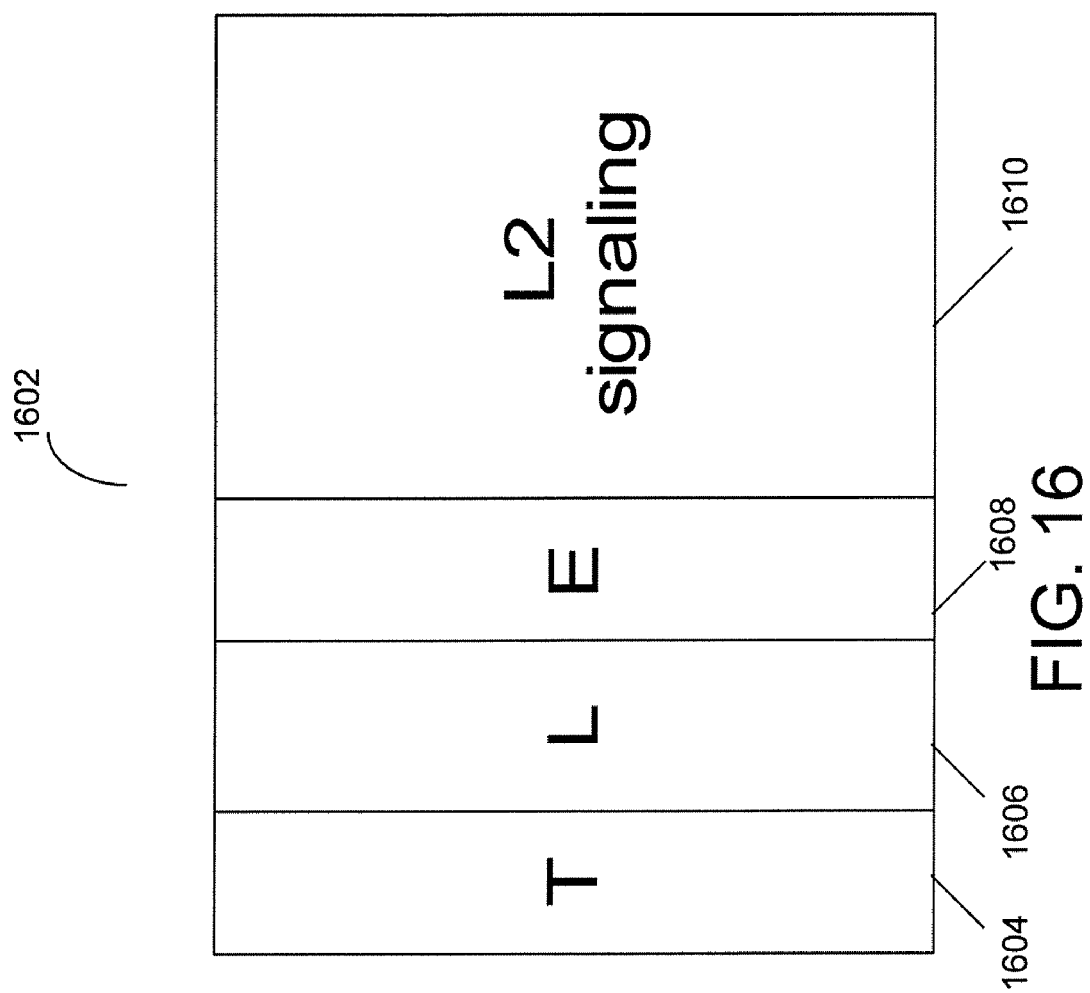
FIG. 16 illustrates additional packet structures which may be used to carry signaling information in accordance with an aspect of the invention.

In an embodiment of the invention, a single P2-1 packet may not be large enough to carry all L2 signaling information. Hence, additional P2-n packets may be needed for carrying and encapsulating L2 signaling. FIG. 16 illustrates the structure of a P2-n packet 1602 which may be used to carry L2 signaling information, such as PSI/SI. The definition of the fields in P2-n, wherein the field lengths are exemplary for various embodiments, are as follows:

T (Type) This 8 bit-field 1604 may indicate the type of the signaling carried within the payload of this packet. Based on the type value, a receiver may be able to decode correctly the carried signaling data. Examples of the signaling type may include e.g. PSI/SI only, PSI/SI and signaling intended for mobile handheld services according to embodiments of the invention.

L (Length) This field 1606 may indicate the length of the P2-n packets, counting all bits following immediately after this field. The length may be expressed as number of bits or bytes depending on the definition.

E (End) This field 1608 may include a one bit flag which indicates whether the current is the last P2-n packet or whether there are other P2-n packets following this packet.

L2 Signaling This field 1610 may be reserved for carrying L2 signaling. The type field 1604 may indicate the information carried within the field.

Depending on the amount of L2 signaling data, plurality of P2-n packets may be used.

Figure 17:
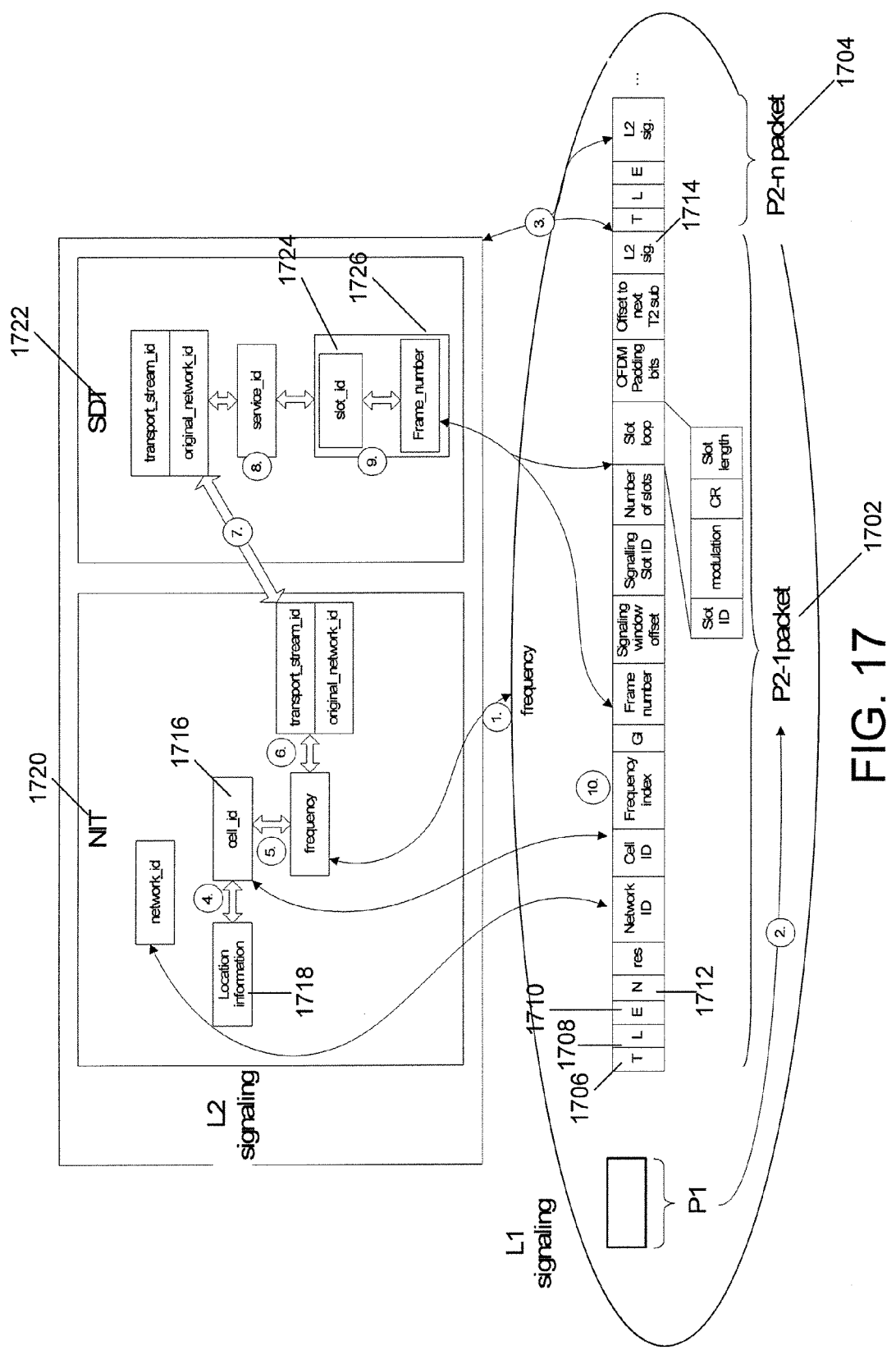
FIG. 17 illustrates an exemplary flow diagram for use in service discovery in accordance with an aspect of the invention.

FIG. 17 depicts a flow diagram illustrating service discovery in accordance with an aspect of the invention. In FIG. 17, L2 signaling information is carried within both packets, i.e. P2-1 and P2-n. Other variations of P2-n may include any combination of data and L2 signaling information carried within either or both packet types.

In FIG. 17, a receiver may seek signals from a frequency band carrying signals according to various embodiments of the invention, as shown at 1. An appropriate frequency may be detected by the preamble pattern provided by P1.

Based on the information carried within P1, a receiver may be able to decode P2-1 1702 and P2-n packets 1704 carried within the following symbols as shown at 2. In an aspect of the invention, four fields may be included within the P2 packet header. The 'T' field 1706 may indicate the type of the current signal. The 'L' field 1708 may indicate the length of the P2. In case the 'E' field 1710 is set to '1', the current P2-1 packet is 'the last,' i.e. there are no consequent P2-n packets to follow. Finally the 'N' field 1712 may indicate whether the current signal carries notification information.

From the P2 packets (i.e. P2-1 and P2-n), the receiver may be able to access the L2 signaling data 1714, which may be carried within the payload of P2-1 and P2-n packets, as shown at 3.

Next, the L2 signaling data 1714, i.e. the specific PSI/SI for this type of transmission in case of carrying only this type of transmission, may map the found signal with network and cell information 1716, as shown at 4. The information of neighbouring cells (including geographical location 1718 of each cell) may be provided by means of Network Information Table (NIT) 1720.

Also, the Time Frequency Slicing (TFS) specific information may be partially carried within PSI/SI. A NIT may map each frequency part of the same TFS frame as shown at 5. The NIT may map each frequency part of the same TFS frame. Finally, NIT maps transport streams to different frequencies and furthermore to different TFS frames, as shown in 6.

In a further aspect of the invention, by following the semantics of legacy PSI/SI, transport streams may be mapped to the services within Service Description Table (SDT) 1722 shown at 7. Services may be further mapped as shown at 8 to the PIDs of each transport stream by use of PAT and PMT, similarly as in legacy DVB systems.

The mapping of each service with slot_id 1724 and frame_number 1726 combinations may be done within the service loop of SDT by adding additional descriptor as shown in 9.

Finally, as shown at 10, the receiver may continue the service discovery procedure within the P2-1 packet, by inspecting which slots may need to accessed in order to receive desired services announced within the SDT. The tables NIT, SDT, PAT, and PMT are used as examples corresponding to present (legacy) DVB tables.

In a further aspect of the invention, the L1 information signaled within the P2-1 packet may relate to the specific signaling window. The starting position of the signaling window may be indicated with the 'signaling window offset-field.' The total number of slots located within the given signaling window may be indicated in the 'number of slots field.' A specific slot ID may be signaled for the purposes of P1 and P2-1 packets. The P2-n packets may be carried within the 'regular slots' and hence may also contain the actual content data. The slot loop indicates the modulation, code rate and length for each slot announced within the loop. In addition, OFDM padding bits-field may be used to indicate the possible padding in the end of frame. Finally, the 'offset to next T2 sub' field may indicate the offset between the current and next sub-signal of the associated frame.

Figure 18:
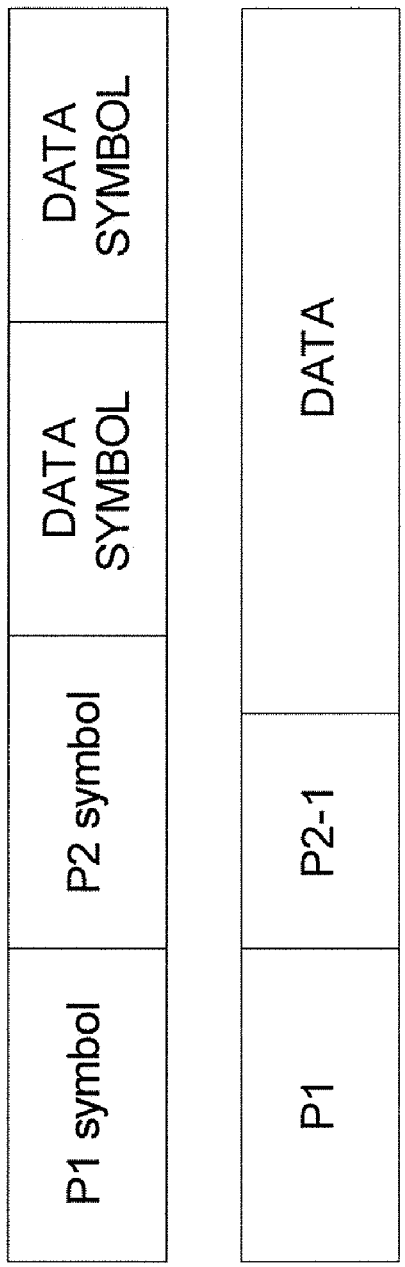
FIGS. 18 and 19 depict relationships between P1, P2, and DATA symbols in accordance with an aspect of the invention.
Figure 19:
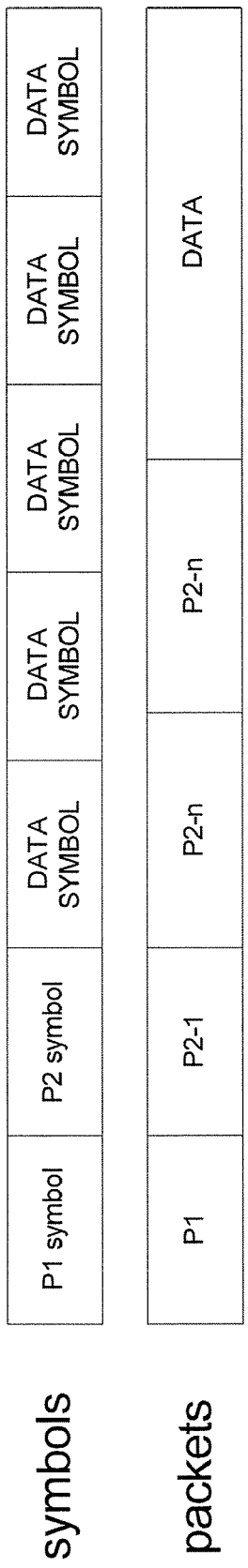

FIG. 18 and FIG. 19 depict the relation between P1, P2 and DATA symbols (i.e. OFDM symbols) by example. From FIGS. 18 and 19, it may be seen how data has been split for the duration of P2 and data symbols. The data packets may be placed immediately after the last P2-n packet and both are carried within the 'DATA symbols.'

Figure 20:
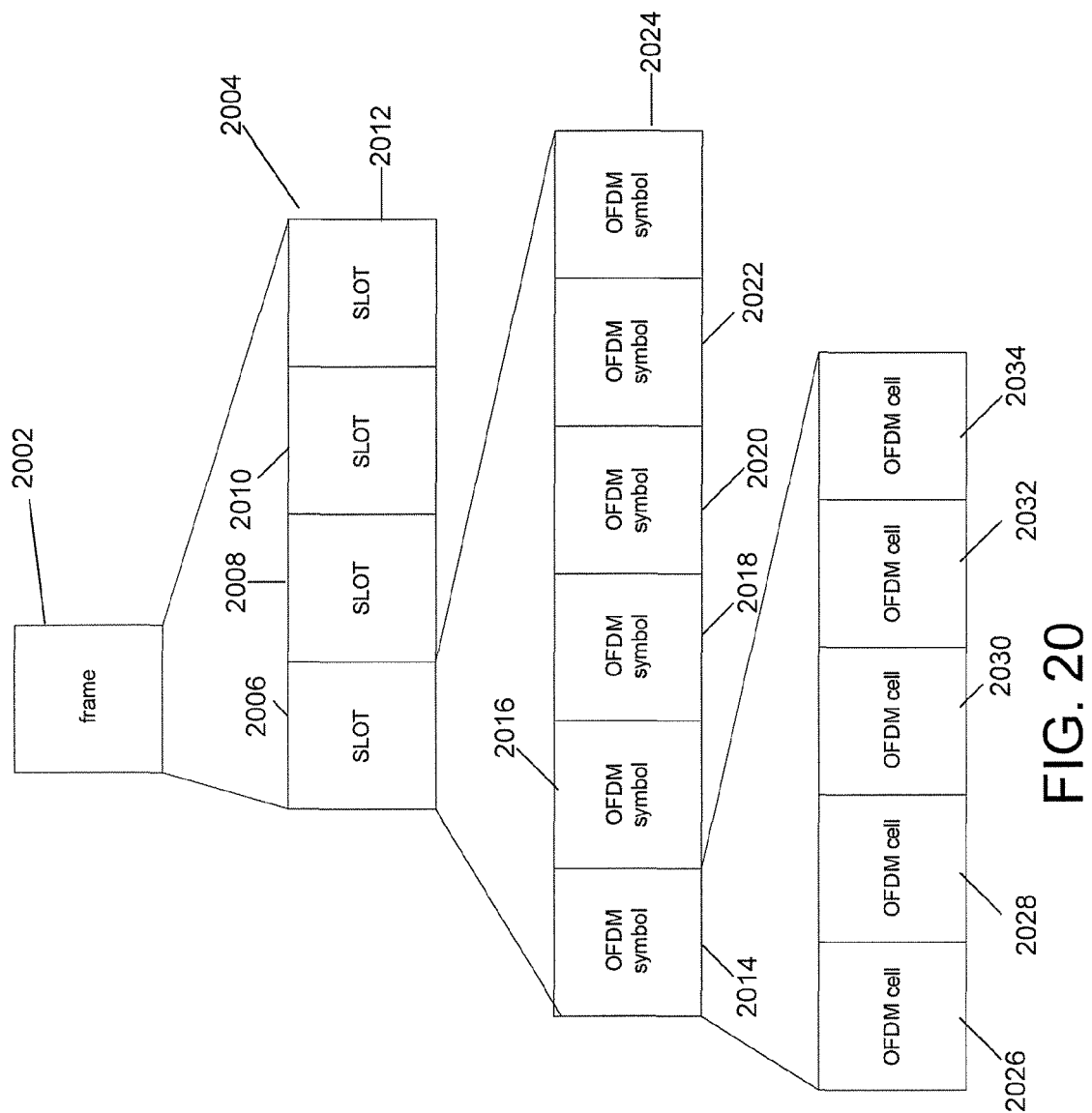
FIG. 20 shows an exemplary frame and slot structure including OFDM symbols and cells in accordance with an aspect of the invention.

FIG. 20 shows an exemplary frame and slot structure in accordance with at least one aspect of the invention. In FIG. 20, a frame 2002 may consist of one or more slots 2004. For example, frame 2002 includes slot 1 2006 through slot 4 2012. Each slot 2006-2012 may include several OFDM (orthogonal frequency division multiplexing) symbols, typically from a few symbols up to some tens of symbols. The services are allocated to these slots so that one or more slots are used for a service. For example, slot 1 2006 may includes a number of OFDM symbols 2014 through 2024. Furthermore, each OFDM symbol may include numerous OFDM cells. For instance, OFDM symbol 2014 includes OFDM cells 2026 through 2034.

Embodiments relate to a detailed scheme for allocating Open Systems Interconnection (OSI) model physical layer (L1) and data link layer (L2) signaling and notification signaling data within the preamble (e.g. P2 symbols) carried in the physical layer. Embodiments relate to transmission of signaling information used by a receiver to decode signaling metadata from the transmission.

Figure 21A:
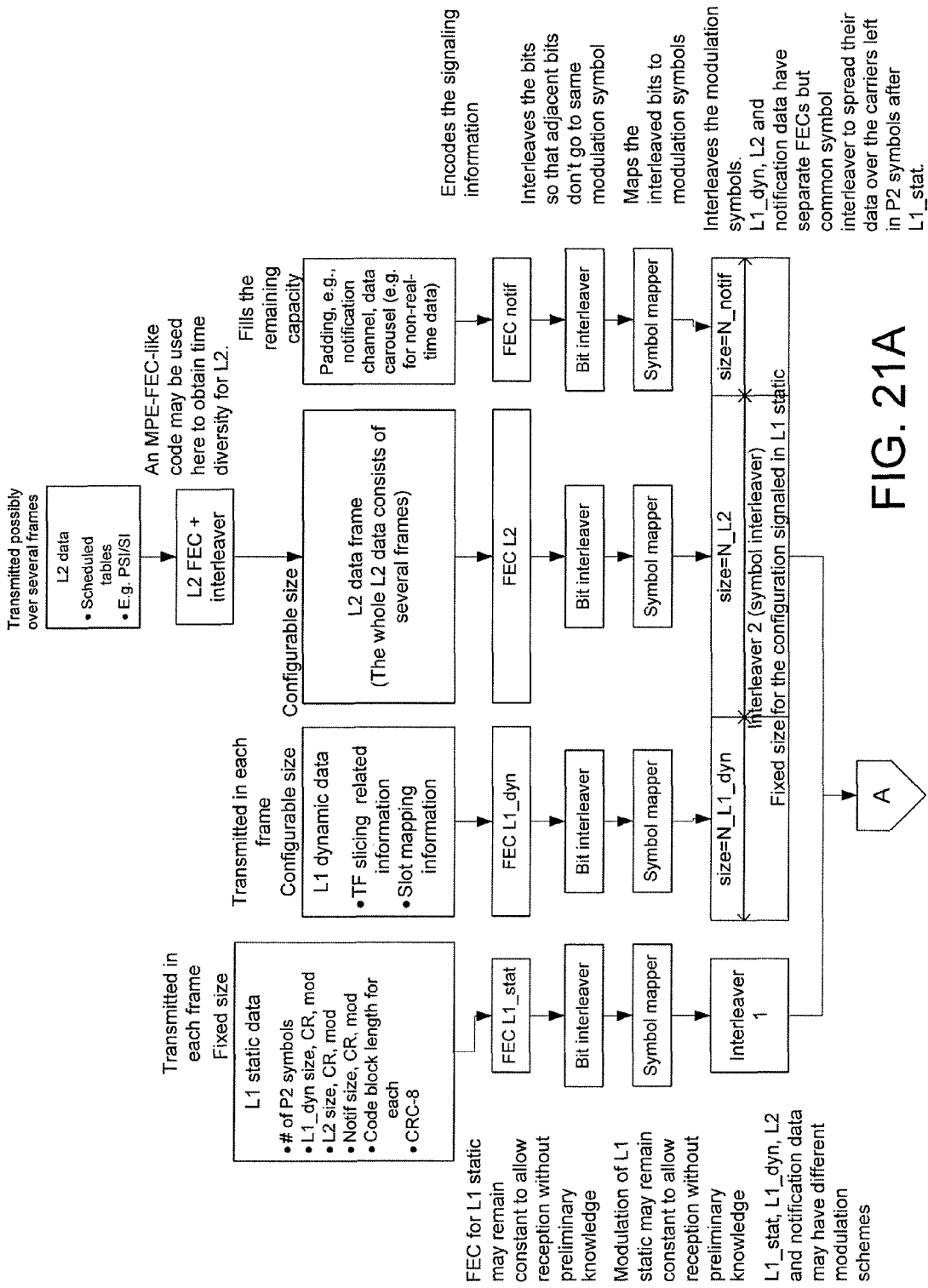
FIGS. 21A and 21B show a block schema for L1 and L2 signaling transmission in accordance with an embodiment.
Figure 21B:
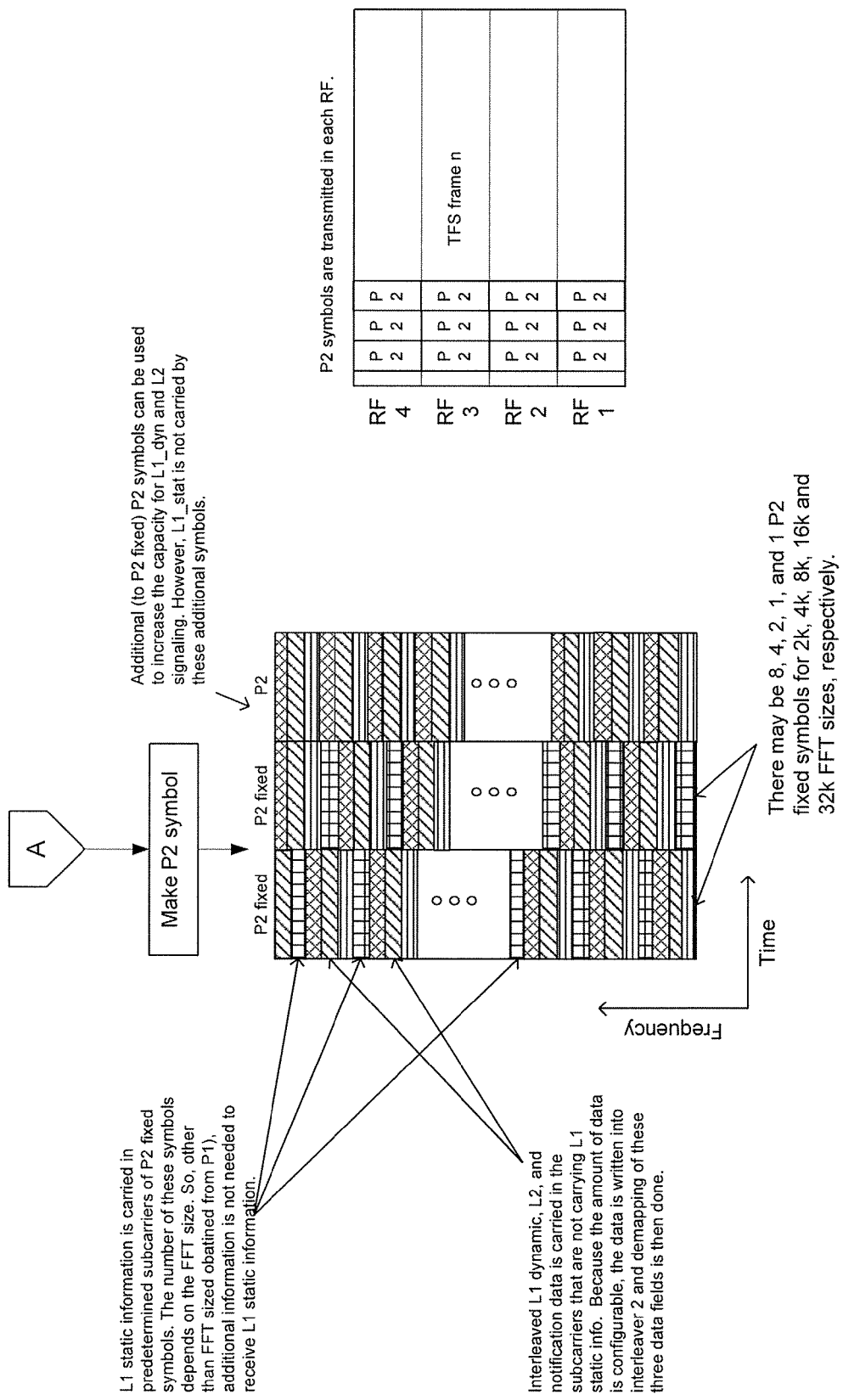

FIGS. 21A and 21B show a block schema for L1 and L2 signaling transmission in accordance with an embodiment. In the embodiment, there are three P2 symbols. Two of the P2 symbols are fixed symbols (8 k mode). The signaling is transmitted in P2 symbols.

The signaling data path should be more robust than the data path. This can be addressed by using lower rate coding and lower order modulations in the transmission of signaling data assuming that P2 has roughly the same amount of time and frequency diversity as the application data. For L1 pre-signaling (also referred to as L1 static) data, the modulation may be, in one embodiment, Quadrature Phase Shift Keying (QPSK) or Binary Phase Shift Keying (BPSK), wherein, for L1 signaling (also referred to as L1 dynamic) data, L2 data, and other data (e.g. non-real-time data), the modulation may be QPSK or some Quadrature Amplitude Modulation (QAM) type including, but not limited to, 16-QAM, 64-QAM and 256-QAM. To achieve similar frequency diversity as the application data, the services should be scheduled in a manner that receiving them enables receiving the signaling data from different frequencies in consequent frames. L1 pre-signaling, being repeated in each frame, obtains its time diversity from the repetition.

FIG. 22 shows P2 symbols in frames and co-scheduled signaling in accordance with an embodiment. FIG. 22 shows two P2 symbols. But in various embodiments, the number of P2 symbols may be three or more.

L1 pre-signaling information may have fixed length and may be interleaved over P2 fixed symbols. L1 signaling data and L2 data may have configurable length, may be interleaved over the full duration, and may have separate coding and separate modulation. The physical layer pipe (PLP) slots may include co-scheduled L1 signaling data signaling.

P2 symbols may have the same Fast Fourier Transform (FFT) mode and guard interval as the data symbols in the frame. In each P2 fixed symbols ⅔ of carriers may be available for signaling data while ⅓ may be reserved for pilots that do not carry data. This relatively large amount of pilots allows for better channel estimation directly from the preamble. The number of P2 fixed symbols in a particular frame depends on the FFT-size used in the system. In an embodiment, 8, 4, 2, 1 and 1 P2 fixed symbols are used per frame for FFT sizes of 2 k, 4 k, 8 k, 16 k, and 32 k, respectively. In order to allow predetermined mapping/demapping, L1 pre-signaling data may be mapped into these P2 fixed symbols. Note that successful demapping of L1 pre-signaling depends upon robust estimation of the FFT size. The FFT size may be decoded from P1, which is received before, and used during, reception of P2.

Besides P2 fixed, there can be configurable P2 symbols which are used to extend the amount of L1 signaling, L2, and notification data, as is appropriate. In configurable P2 symbols, normal pilot patterns may be used. On the other hand, if there is not enough signaling data to fill the P2 fixed symbols, application data may be transmitted in these symbols. Similar P2 symbols (except for the frequency indicator (P2 symbol may carry frequency indicator for identification of the RF channel on which P2 is received) and possible application data transmitted in the P2 symbol) may be transmitted in each Radio Frequency (RF) channel of the Time-Frequency Slicing (TFS) system.

L1 pre-signaling may be sent only in the P2 fixed symbols (i.e., it may not spread to the P2 symbols following the P2 fixed symbols). The size of L1 pre-signaling data may be fixed, i.e., it may be independent of the amount of services in the system or the network configuration, and it may be transmitted in each frame. Also, L1 pre-signaling may be transmitted with a known modulation, code rate, and subcarriers of P2 fixed symbols to enable its reception without preliminary knowledge, except FFT-size, which may be obtained from P1 symbol. The subcarriers that carry L1 pre-signaling information may either be tabulated for each FFT size or may be obtained by a pseudorandom sequence. The transmission of L1 pre-signaling may be separated from the transmission of L1 signaling, L2, and notification data since the L1 pre-signaling enables the reception of L1 signaling, L2, and notification data. This means that L1 pre-signaling may have its own Forward Error Coding (FEC) and interleaver. Since the amount of L1 data is rather small (in one embodiment, 89 bits), the use of Low Density Parity Check (LDPC) code (for example if code words of length 16200 or 64800 bits are used as in Digital Video Broadcasting-Satellite-Second Generation (DVB-S2) system) may be inefficient, since heavy puncturing and shortening of LDPC code has a negative effect on the code performance. Under such circumstances, convolutional codes or shorter block codes may be useful.

The spreading of L1 pre-signaling over multiple P2 symbols gives time diversity for lower FFT sizes (2 k, 4 k, and 8 k), which are more sensitive to impulse noise than larger FFT sizes.

L1 signaling data may have its own FEC code, bit interleaver, and symbol mapper, but L1 signaling may share a common symbol interleaver with L2 and notification data. The bit interleaver may interleave the coded bits so that adjacent bits don't go to the same modulation symbol. Symbol interleaving together with individual coding and symbol mapping makes it possible to have different coding and modulation parameters for L1 signaling, L2, and notification data. The common interleaver also allows for time and frequency (within carriers) diversity over OFDM symbols used in transmission of signaling data (P2 and P2 fixed). In this way, resistance to error bursts, for example, GSM bursts, may be obtained. The amount of L1 signaling data in frames is typically greater that that of L1 pre-signaling. The size of L1 signaling data in a frame may vary from 204 bits in one embodiment (1 Physical Layer Pipe (PLP), 1 RF frequency) to 19744 bits (256 PLPs, 6 RF frequencies). With L1 signaling, DVB-S2 LDPC code with short frame (16200 bits) could be used (for example with coderate ¼, 4050 bits of useful information are transmitted and no heavy puncturing or shortening is called for). Variable-length nature of L1 signaling combined with a block code poses some constraints on the design of FEC.

Scheduled L2 information may be encoded and interleaved. Some kind of Multi Protocol Encapsulation—Forward Error Correction (MPE-FEC)-like code for groups of tables with similar repetition interval may be used to perform this task to obtain maximal time diversity. The motivation for this L2 FEC is that greater time diversity may be obtained with smaller memory than at lower layer FEC, since hard decision information (hard bits) is buffered instead of soft information (soft bits) (1 bit instead of 5 bits, for example). This data may then be spitted to L2 data frames to be transmitted in the preambles of several frames. Such an L2 data frame may be encoded, bit interleaved, and symbols mapped and then interleaved together with L1 signaling and notification data. The size of an L2 data frame may be configurable and it is likely to be greater (e.g., ~50 kbit) than that of L1 signaling. Therefore, with L2 data frames, LDPC code (FEC L2 in FIG. 21A) with long frames (64800 bits), as for example in DVB-S2, could be used for optimal code performance. Again, knowing the amount of data is useful for selecting an optimal FEC scheme.

Figure 23:
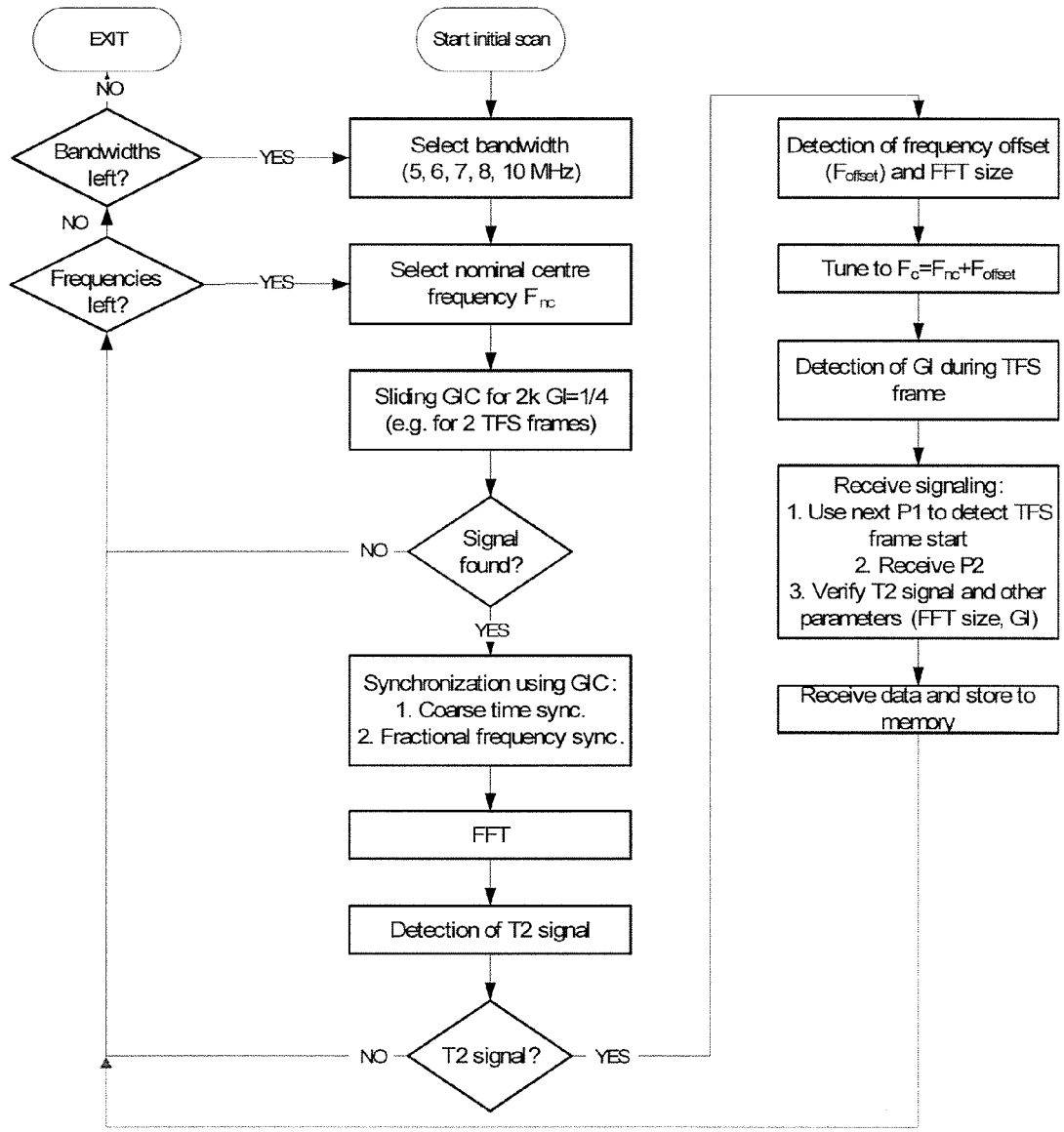
FIG. 23 is a flow diagram that shows steps that may be performed by a receiver in an initial scan to receive P1 in accordance with one or more embodiments.

FIG. 23 is a flow diagram that shows steps that may be performed by a receiver in an initial scan to receive P1 in accordance with one or more embodiments.

In the initial scan, the receiver may be tuned to the nominal centre frequency of the channel, and it may start to look for the P1 symbol. The following procedure may then be repeated at selected channels (and bandwidths)—but not necessarily with every frequency offset since the P1 symbol may be detected at the nominal centre frequency regardless of the used offset.

The first task after bandwidth and nominal centre frequency selection is to find the existence of a T2-signal. The P1 symbol can be found, e.g., by guard interval correlation, which is immune to frequency offset. Using guard interval correlation (GIC) helps also in T2-signal detection since the lack of a 2 k symbol implicates a non-T2 channel.

Guard interval correlation is intended for situations where the delay spread of the channel stays within the guard interval, which may not be the case with P1 symbol in large scale single frequency networks (SFN) (e.g. with 32 k mode). In this case, delays longer than the guard interval—especially delays that are multiples of the useful symbol duration—produce false correlation.

It should be noted, however, that the symbol timing in presence of strong SFN echoes is not only a P1-specific problem because the receiver anyway needs to be able to synchronize to the correct path. The difference is that P1 correlation has higher noise level because of the shorter GIC window.

Coarse time and fractional frequency synchronization are obtained from the guard interval correlation. These are coarse estimates that are used for the P1 symbol itself, and they may be refined using the following symbols. It is assumed that these estimates are accurate enough to detect one of the five pseudorandom binary sequence (PRBS) patterns to find the FFT-size.

For a fast initial scan, the channels that do not contain a T2-signal should be discarded relatively quickly. The preamble structure in accordance with embodiments supports a stepwise detection where the non-T2 channels can be discarded relatively quickly, and the detection of a T2-signal may be confirmed by reading the L1 pre-signaling signaling.

First elimination may be done by the guard interval correlation. P1 signal may be repeated every frame (around 200 ms) and it is rather robust in terms of signal to noise ratio (SNR) requirements so testing two consecutive P1 positions may be reliable enough to detect the T2 signal. This would take around 500 ms per RF-channel. A receiver may then decide whether a possible P1 symbol has been found. If this is done over the 39 UHF-channels and even with 3 channel bandwidths, the total time used for the scan is approximately 58 seconds. Note that trying to scan different bandwidths at the same time does not really help as the channel rasters are different.

Once a possible P1 symbol has been found, the receiver may perform coarse synchronization and FFT. Next, the receiver may use the sparse carrier raster to differentiate between T2- and other 2 k signals. Thus, the non-T2 signals can most likely be detected from the first received P1 symbol.

Detection of the frequency offset is based on finding the shifted pilot pattern. The detection of frequency offset and FFT-size may be separated by first using the power at the assumed pilot carriers to find the correct offset, and, after that, calculating the correlation to the five PRBSs. On the other hand, the PRBSs could be used already when finding the frequency offset. The sparse carrier raster decreases the complexity of the search algorithms.

After the frequency offset has been detected, the receiver can be tuned to receive the data symbols. Another task is to find out the used guard interval to decode the P2 symbol. As the P1 symbol does not carry any signaling information of the GI, the receiver may detect this by using the normal OFDM symbols during the frame. The P2 symbol immediately after the detected P1 can not be decoded. But there is enough time to detect the GI before the next frame as the whole 200 ms frame duration can be used. This adds another 200 ms to the signal acquisition time, but this happens most likely only with the FOUND T2-signals, not with every tested channel. As the maximum number of parallel multiplexes typically is in the order of 7 to 8, the total time added to the scan sequence is less than 2 s.

In case the frame duration is configurable, the frame synchronization can be obtained by recognising the next P1 symbol. The detected parameters from the L1 pre-signaling signaling in the P2 symbols are then confirmed.

In one embodiment after P1 is found and decoded, the receiver receives P2 from the next TFS frame. The P1 of that frame is used for detecting the start of TFS frame.

Figure 24:
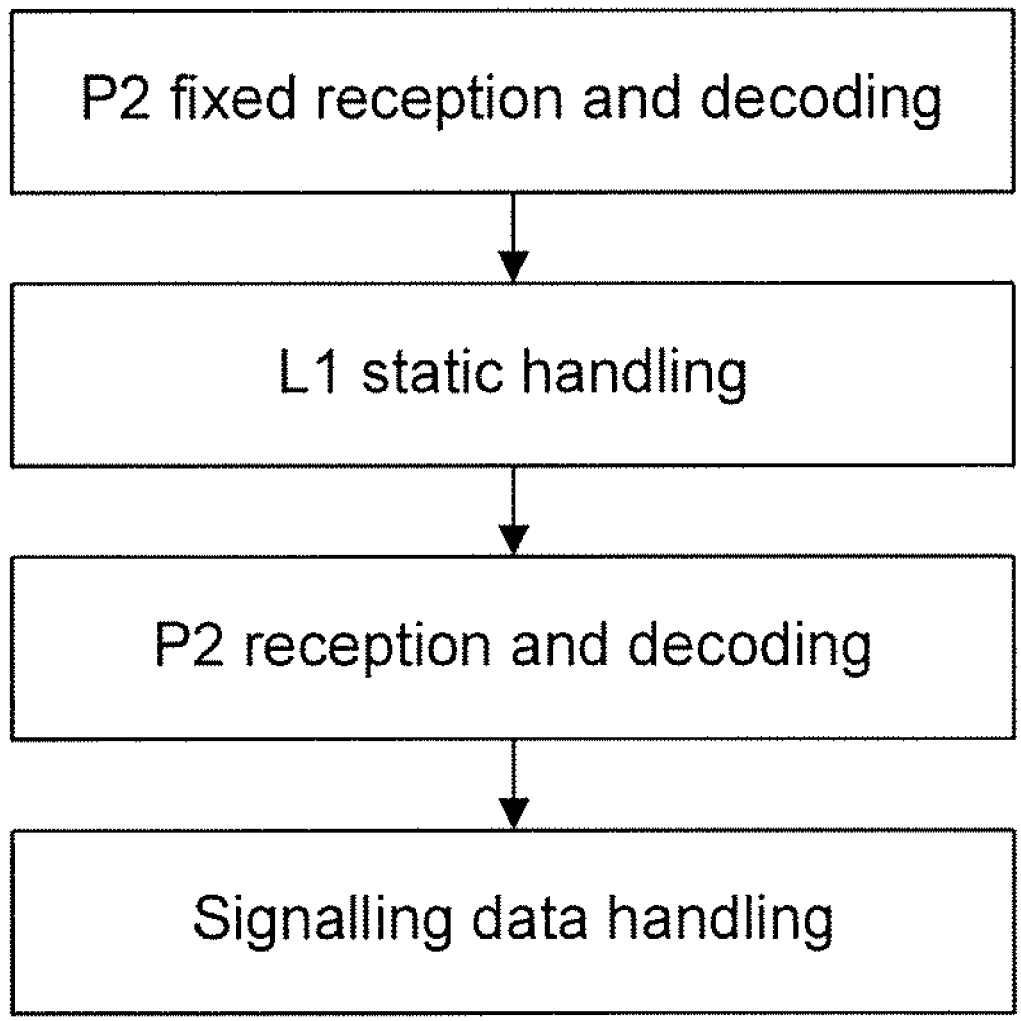
FIG. 24 is a flow diagram showing high level data flow of receiver procedures in P2 reception, decoding, and handling in accordance with embodiments.

A more detailed discussion follows of decoding and handling P2 symbols in accordance with embodiments. FIG. 24 is a flow diagram showing high level data flow of receiver procedures in P2 reception, decoding, and handling in accordance with embodiments.

The P2 fixed symbol comprises the signaling parameters that are used for receiving, decoding, and handling P2 symbols related to L1 and L2 signaling and notification signaling. Additional signaling categories are also possible. The P2 fixed symbol may be interleaved with a fixed scheme to facilitate detection of the P2 fixed symbol by the receiver.

Figure 25:
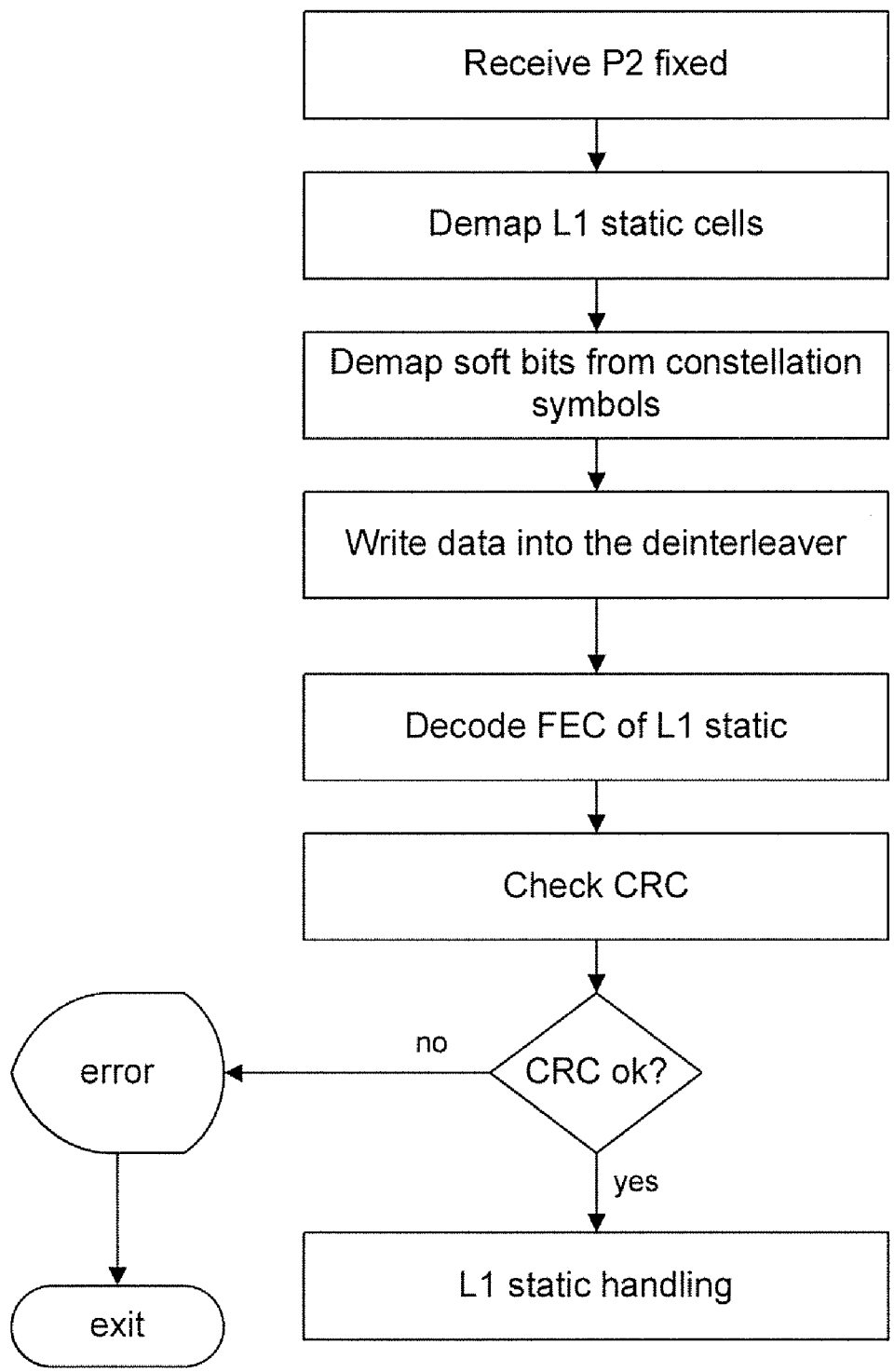
FIG. 25 is a flow diagram showing steps in accordance with an embodiment for reception and decoding of P2 fixed information.

FIG. 25 is a flow diagram showing steps in accordance with an embodiment for reception and decoding of P2 fixed information. P2 fixed symbols are received. P1 may be used to detect TFS frame start. FFT size may determine the number of fixed P2 symbols.

L1 pre-signaling cells are then demapped. Mapping of L1 pre-signaling information to the OFDM cells may be fixed. The mapping may be defined separately based on the FFT size.

Soft bits from constellation symbols are then demapped. The constellation may be, for example, BPSK or QPSK.

Data is then written into the interleaver, which may be, for example, a bit level block deinterleaver.

FEC of L1 pre-signaling information is then decoded, and the Cyclic Redundancy Coding (CRC) is checked. If the CRC test passes, then L1 pre-signaling handling is performed. Otherwise, if the CRC test fails, an error processing may be performed.

Next, after the receiver has successfully been able to receive and decode the P2 fixed symbols, it may proceed into the inspection of the L1 pre-signaling parameters carried within the P2 fixed symbols.

Figure 26:
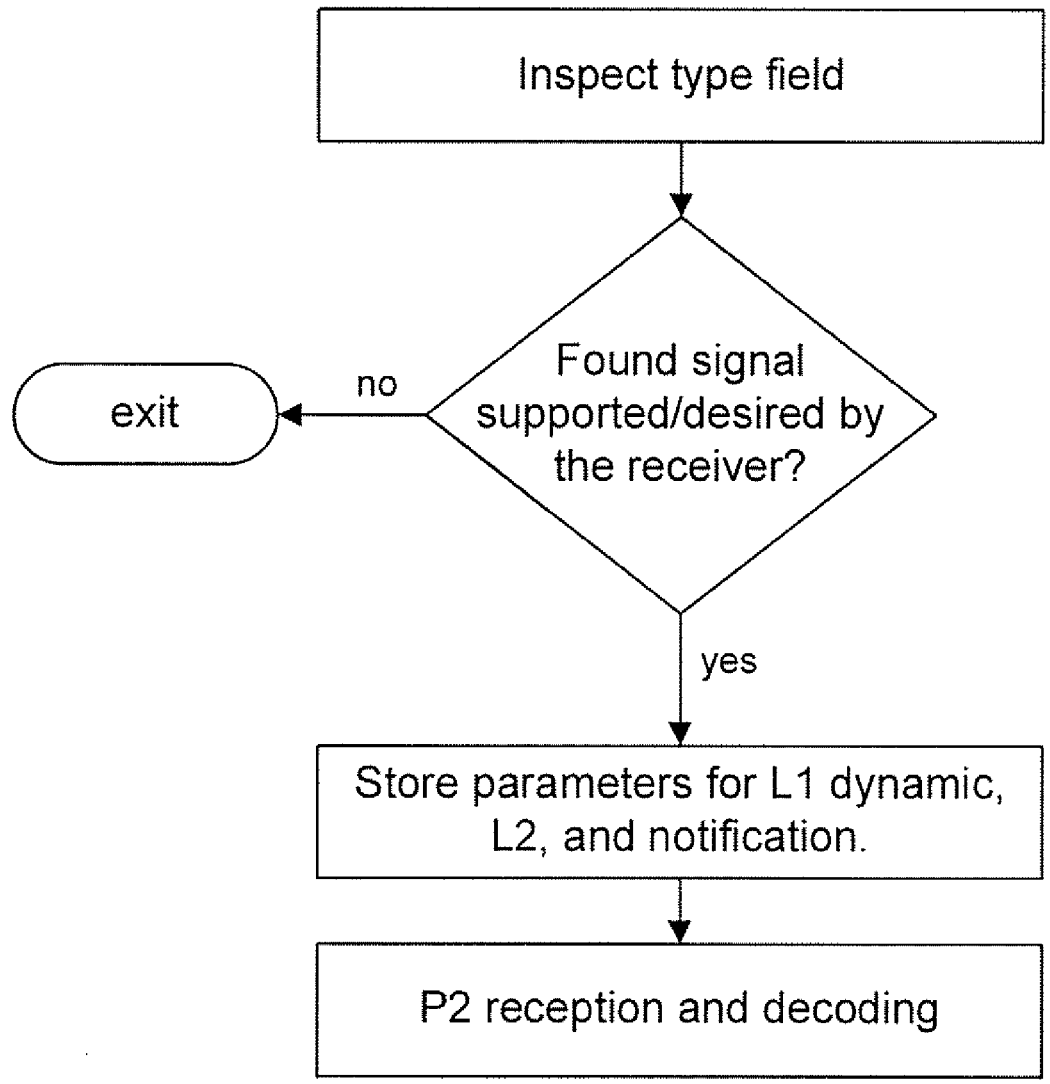
FIG. 26 depicts a flow diagram for handling L1 pre-signaling information in accordance with one or more embodiments.

FIG. 26 depicts a flow diagram for handling L1 pre-signaling information in accordance with one or more embodiments. The type field is inspected. The type field may indicate one or more of the following types of information about the found signal: T2 or T2 extension (e.g., Next Generation Handheld (NGH)); Multiple-Input Multiple-Output (MIMO), Multiple-Input Single-Output (MISO) or Single-Input Single-Output (SISO)—these are antennae technologies having multiple or single antennae at the transmitter and receiver; and TS only, Generic Stream Encapsulation (GSE) only, or both. If the found signal is supported and/or desired by the receiver, then parameters for L1 signaling, L2, and notification are stored. The parameters may include, but are not limited to: number of symbols carrying signaling (5 bits); length-L1 (size) (16 bits); L1_dyn_mod (3 bits); L1_dyn_cr (3 bits); L1_dyn_FEC_block (1 bit); Length_L2 (18 bits); L2_mod (3 bits); L2_cr (4 bits); L2_FEC_block (1 bit); Length_notif (18 bits); Notif_mod (3 bits); Notif_cr (4 bits); and Notif_FEC_block (1 bit). These parameters and their sizes are exemplary for various embodiments. As will be apparent other suitable parameters and parameter sizes may also be used.

Based on the L1 pre-signaling information, the receiver is able to receive and decode the remaining P2 symbols which carry information about L1, L2, and notification.

Figure 27:
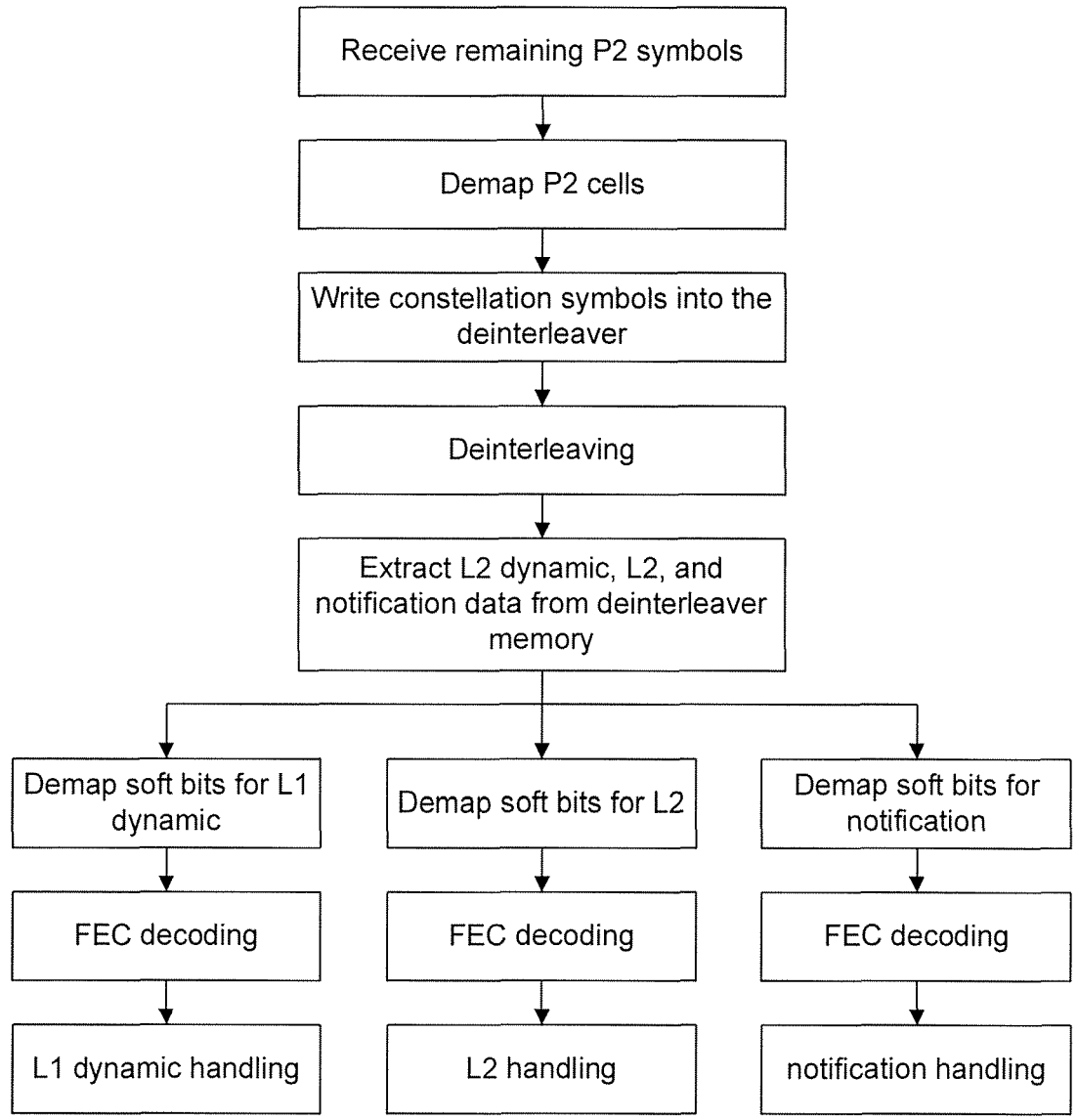
FIG. 27 is a flow diagram showing steps for reception and decoding of P2 symbols carrying L1 and L2 signaling an and notification information.

FIG. 27 is a flow diagram showing steps for reception and decoding of P2 symbols carrying L1 and L2 signaling an and notification information. Remaining P2 symbols are received. The number of P2 symbols may be derived from the "number of symbols carrying signaling" parameter. P2 cells, other than those belonging to L1 pre-signaling, are then demapped. Constellation symbols are then written into the deinterleaver. The size of the interleaver may be determined by the number of P2 symbols, FFT size, and by the size of L1 pre-signaling. Length_L1, Length_L2, and Length_notif are then used in performing deinterleaving. L1 signaling, L2, and notification data is then extracted from the deinterleaver memory.

Soft bits are demapped and FEC decoding and data handling are performed separately for the L1 signaling, L2, and notification data extracted from the deinterleaver memory. If the notification flag in L1 pre-signaling indicates that notification is not present, then the notification processing is omitted.

Figure 28:
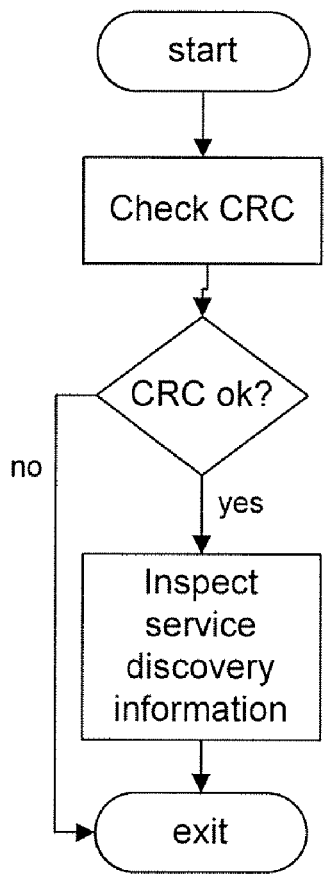
FIG. 28 is flow diagram for performing CRC checks on the L1 signaling and L2 data in accordance with an embodiment.

FIG. 28 is flow diagram for performing CRC checks on the L1 signaling and L2 data in accordance with an embodiment.

Figure 29:
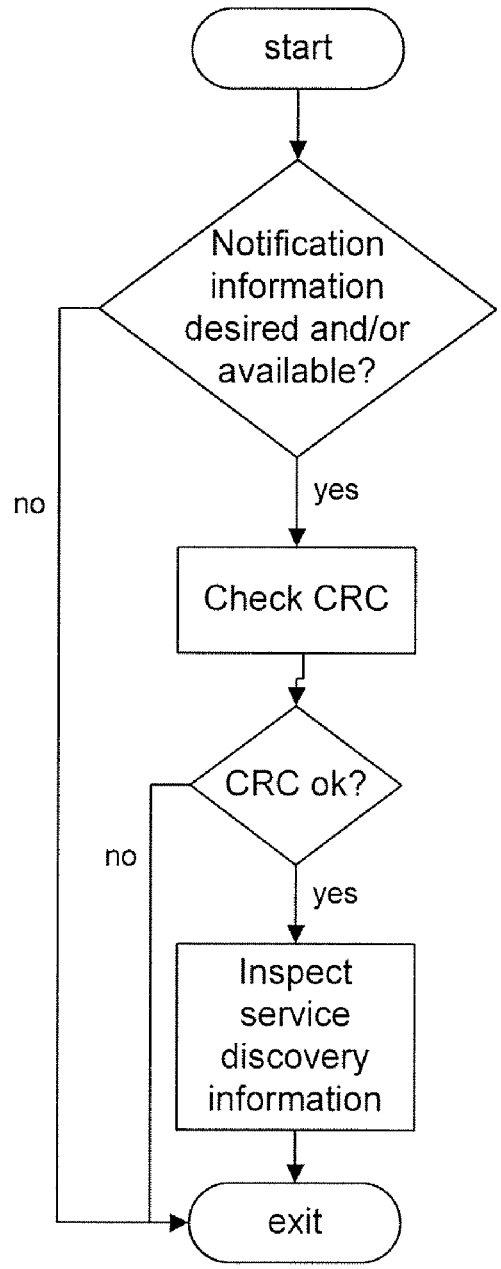
FIG. 29 is flow diagram for performing CRC checks on the notification data in accordance with an embodiment.

FIG. 29 is flow diagram for performing CRC checks on the notification data in accordance with an embodiment.

FIG. 30 shows a division of L1 parameters into L1 pre-signaling parameters and L1 signaling parameters in accordance with an embodiment. The idea in the division to pre-signaling and signaling is based on L1 pre-signaling being transmitted with predetermined modulation and code rate such that L1 pre-signaling can be received without preliminary knowledge on the network. L1 pre-signaling makes it possible to receive the L1 signaling, L2, and notification data that can have configurable code rates and modulations. Therefore, L1 pre-signaling signaling can be considered as a pointer to other signaling (i.e., signaling of signaling information). L2 signaling is divided into network specific (left side of FIG. 30) and service specific information (right side). L1 signaling is divided into pre-signaling and signaling parts. The pre-signaling part mainly comprises of parameters used for receiving L1 signaling.

The main task of L1 pre-signaling signaling is to inform the receiver how to receive the signaling itself (L1 signaling and L2). L1 pre-signaling parameters to be transmitted in accordance with an embodiment are shown in FIG. 30. L1 pre-signaling enables the reception of L1 signaling, L2, and notification data by informing the receiver about the amount of used P2 symbols, used modulation, coding and amount of data related with them. CRC-8 may be used to determine whether the L1 pre-signaling signaling was received correctly. The type field may include information, e.g., about the transmission system (DVB-T2, DVB-H2, future DVB-T systems), MIMO transmission (single or multiple transmission (Tx) antennas), used protocols (TS, GSE).

L1 pre-signaling should be received without the help of other signaling. That is, the coding and modulation should be predetermined for L1 pre-signaling data. And the size and mapping of the data to the OFDM cells should also be fixed. An example of the more detailed definition of L1 pre-signaling parameters, listed in FIG. 30, is given in the following:

| | |
|---|---|
| Type | This field includes information, e.g., about the transmission system (DVB-T2, DVB-H2, future DVB-T systems), MIMO transmission (single or multiple Tx antennas), used protocols (TS, GSE) of the associated TFS frame. |
| Notification flag | This field indicates whether notification information is carried within the frame. |
| CRC-8 | This field is needed to ensure that L1 pre-signaling data is error-free. |
| NUM_symbols | This field indicates the number of signaling symbols (i.e. P2 symbols used to carry L1_dyn, L2 and notification data) |
| N_L1 (size) | This field indicates the amount of L1 signaling data as OFDM cells. |
| L1_mod | This field indicates the modulation used for the cells carrying L1 signaling data. |
| L1_cr | This field indicates the coderate used for the cells carrying L1 signaling data. |

| | |
|---|---|
| L1_FEC_block | This field indicates the used FEC block size for the L1 signaling data. |
| N_L2 | This field indicates the amount of L2 signalling data as OFDM cells |
| L2_mod | This field indicates the modulation used for the cells carrying L2 data. |
| L2_cr | This field indicates the coderate used for the cells carrying L2 data. |
| L2_FEC_block | This field indicates the used FEC block size for the L2 data. |
| N_Notif | This field indicates the amount of L2 signalling data as OFDM cells |
| Notif_mod | This field indicates the modulation used for the cell carrying notification data. |
| Notif_cr | This field indicates the coderate used for the cells carrying notification data. |
| Notif_FEC_block | This field indicates the used FEC block size for the notification data. |

L1 signaling data may convey information that enables the reception of services. L1 signaling data may contain the information listed as L1 signaling data in FIG. 30. Fundamental network parameters such as, for example, number of RF frequencies and used FFT-size may be signaled in L1 signaling. Further, the slot structure to allow reception of TF sliced transmission may be signaled. It may be assumed that the time offset is the same between RF channels. That way one slot structure in L1 signaling may be signaled instead of signaling it for all frequencies.

In the L1 signaling data listed in FIG. 30, FRAME_IDX, RF_OFFSET, SLOT_START, SLOT_LENGTH, and PLP_BUFF_SIZE may change dynamically from frame to frame, whereas the remaining parameters may change when the network is reconfigured or PLPs are added or removed (configurable).

L2 information may contain service and system specific information. At the first phase of DVB-T2, PSI/SI inherent from DVB-T is to be transmitted over DVB-T2. PSI/SI tables have different repetition interval. Repetition interval shorter than TFS frame duration is not possible when using preambles. L2 signaling enables the receiver to map the services to certain slots (structure signaled in L1 signaling) and frames and thus to receive them.

Co-scheduled signaling allocates cells immediately adjacent to the service sub-slices to carry the L1 signaling data for the service in question only. This will allow the receiver following a service to get the L1 signaling information without having to receive P2 every time.

The notification channel may be used to transmit notifications and data carousel that is available for receivers receiving whichever PLP.

One or more aspects of the invention may be embodied in computer-executable instructions, such as in one or more program modules, executed by one or more computers or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), application specific integrated circuits (ASIC), and the like.

Embodiments include any novel feature or combination of features disclosed herein either explicitly or any generalization thereof. While embodiments have been described with respect to specific examples including presently preferred modes of carrying out the invention, those skilled in the art will appreciate that there are numerous variations and permutations of the above described systems and techniques. Thus, the spirit and scope of the invention should be construed broadly as set forth in the appended claims.

We claim:
1. A method comprising:
receiving fixed preamble symbols;
decoding layer 1 (L1) pre-signaling information from the fixed preamble symbols;
determining that a cyclic redundancy coding check passes based on an analysis of cyclic redundancy coding of the decoded L1 pre-signaling information; and
in response to determining that the cyclic redundancy coding check passes, processing the decoded L1 pre-signaling information, the processing including:
inspecting a type field of the decoded L1 pre-signaling information to identify a type field value,
determining that the identified type field value is one of a plurality of supported types, each of the plurality of supported types identifying different information about transmitted information, and
in response to determining that the identified type field is one of the plurality of supported types, extracting one or more parameters for L1 signaling information from the decoded L1 pre-signaling information, storing the one or more parameters for L1 signaling information, and receiving and decoding additional preamble symbols.

2. The method of claim 1, wherein processing the decoded L1 pre-signaling information further comprises: demapping preamble cells other than preamble cells belonging to L1 pre-signaling information.

3. The method of claim 2, wherein processing the decoded L1 pre-signaling information further comprises: deinterleaving the additional preamble symbols to generate deinterleaved L1 signaling information.

4. The method of claim 3, wherein processing the decoded L1 pre-signaling information further comprises: demapping soft bits, forward error correction decoding, and cyclic redundancy coding checking the deinterleaved L1 signaling information.

5. The method of claim 3, wherein processing the decoded L1 pre-signaling information further comprises: storing parameters for data link layer information, deinterleaving the additional preamble symbols to generate deinterleaved data link layer information, demapping soft bits, forward error correction decoding, and cyclic redundancy coding checking the deinterleaved data link layer information.

6. The method of claim 3, wherein processing the decoded L1 pre-signaling information further comprises: storing parameters for notification information, deinterleaving the additional preamble symbols to generate deinterleaved notification information, demapping soft bits, forward error correction decoding, and cyclic redundancy coding checking the deinterleaved notification information.

7. An apparatus comprising:
a processor; and
a memory storing computer executable instructions configured to, with the processor, cause the apparatus to:
receive fixed preamble symbols;
decode layer 1 (L1) pre-signaling information from the fixed preamble symbols;
determine that a cyclic redundancy coding check passes based on an analysis of cyclic redundancy coding of the decoded L1 pre-signaling information; and
in response to determining that the cyclic redundancy coding check passes, process the decoded L1 pre-signaling information, the processing including:
inspecting a type field of the decoded L1 pre-signaling information to identify a type field value,
determining that the identified type field value is one of a plurality of supported types, each of the plurality of supported types identifying different information about transmitted information, and
in response to determining that the identified type field is one of the plurality of supported types, extracting one or more parameters for L1 signaling information from the decoded L1 pre-signaling information, storing the one or more parameters for L1 signaling information, and receiving and decoding additional preamble symbols.

8. The apparatus of claim 7, wherein processing the decoded L1 pre-signaling information further comprises: demapping preamble cells other than preamble cells belonging to L1 pre-signaling information.

9. The apparatus of claim 8, wherein processing the decoded L1 pre-signaling information further comprises: deinterleaving the additional preamble symbols to generate deinterleaved L1 signaling information.

10. The apparatus of claim 9, wherein processing the decoded L1 pre-signaling information further comprises: demapping soft bits, forward error correction decoding, and cyclic redundancy coding checking the deinterleaved L1 signaling information.

11. The apparatus of claim 9, wherein processing the decoded L1 pre-signaling information further comprises: storing parameters for data link layer information, deinterleaving the additional preamble symbols to generate deinterleaved data link layer information, demapping soft bits, forward error correction decoding, and cyclic redundancy coding checking the deinterleaved data link layer information.

12. The apparatus of claim 9, wherein processing the decoded L1 pre-signaling information further comprises: storing parameters for notification information, deinterleaving the additional preamble symbols to generate deinterleaved notification information, demapping soft bits, forward error correction decoding, and cyclic redundancy coding checking the deinterleaved notification information.

13. A method comprising:
causing, by a computing device, to be transmitted by a transmitter, layer 1 (L1) pre-signaling information with predetermined modulation and a predetermined code rate, wherein the L1 pre-signaling information includes parameters for use in receiving L1 signaling information and a type field that identifies one of a plurality of types, each of the plurality of types identifying different information about transmitted information, and the type field's value describing at least one of a transmission system type, a used protocol, and an antenna technology type; and causing, by a computing device, to be transmitted by a transmitter, the L1 signaling information with configurable code rates and configurable modulation.

14. The method of claim 13, wherein the L1 pre-signaling information has a fixed length.

15. The method of claim 13, wherein the L1 pre-signaling information is interleaved over fixed preamble symbols.

16. The method of claim 13, wherein the L1 pre-signaling information specifies parameters for use in receiving data link layer information, and wherein the L1 signaling information and the data link layer information have configurable lengths.

17. The method of claim 13, wherein the L1 pre-signaling information specifies parameters for use in receiving data link layer information, and wherein the L1 signaling information and the data link layer information have separate code rates and separate modulation.

18. The method of claim 13, wherein the L1 signaling information specifies a number of used RF frequencies and an FFT-size.

19. The method of claim 13, wherein the L1 pre-signaling information specifies parameters for use in receiving data link layer information, and wherein the data link layer information includes network-specific information and service-specific information.

20. An apparatus comprising:
a processor; and
a memory storing computer executable instructions configured to, with the processor, cause the apparatus to:
cause to be transmitted by a transmitter layer 1 (L1) pre-signaling information with predetermined modulation and a predetermined code rate, wherein the L1 pre-signaling information includes parameters for use in receiving L1 signaling information and a type field that identifies one of a plurality of types, each of the plurality of types identifying different information about transmitted information, and the type field's value describing at least one of a transmission system type, a used protocol, and an antenna technology type; and
cause to be transmitted by a transmitter the L1 signaling information with configurable code rates and configurable modulation.

21. The apparatus of claim 20, wherein the L1 pre-signaling information has a fixed length.

22. The apparatus of claim 20, wherein the L1 pre-signaling information is interleaved over fixed preamble symbols.

23. The apparatus of claim 20, wherein the L1 pre-signaling information specifies parameters for use in receiving data link layer information, and wherein the L1 signaling information and the data link layer information have configurable lengths.

24. The apparatus of claim 20, wherein the L1 pre-signaling information specifies parameters for use in receiving data link layer information, and wherein the L1 signaling information and the data link layer information have separate code rates and separate modulation.

25. The apparatus of claim 20, wherein the L1 signaling information specifies a number of used RF frequencies and an FFT-size.

26. A non-transitory computer readable medium storing computer executable instructions that, when executed, cause a processor to:
receive fixed preamble symbols;
decode layer 1 (L1) pre-signaling information from the fixed preamble symbols;

determine that a cyclic redundancy coding check passes based on an analysis of cyclic redundancy coding of the decoded L1 pre-signaling information; and in response to determining that the cyclic redundancy coding check passes, process the decoded L1 pre-signaling information, the processing including:

inspecting a type field of the decoded L1 pre-signaling information to identify a type field value, determining that the identified type field value is one of a plurality of supported types, each of the plurality of supported types identifying different information about transmitted information, in response to determining that the identified type field is one of the plurality of supported types, extracting one or more parameters for L1 signaling information from the decoded L1 pre-signaling information, storing the one or more parameters for L1 signaling information, and receiving and decoding additional preamble symbols.

27. The non-transitory computer readable medium of claim 26, wherein the computer executable instructions, when executed, cause the processor to demap preamble cells other than preamble cells belonging to L1 pre-signaling information.

28. The non-transitory computer readable medium of claim 27, wherein the computer executable instructions, when executed, cause the processor to deinterleave the additional preamble symbols to generate deinterleaved L1 signaling information.

29. A non-transitory computer readable medium storing computer executable instructions configured to, when executed, cause a processor to:

cause to be transmitted by a transmitter layer 1 (L1) pre-signaling information with predetermined modulation and a predetermined code rate, wherein the L1 pre-signaling information includes parameters for use in receiving L1 signaling information and a type field that identifies one of a plurality of types, each of the plurality of types identifying different information about transmitted information, and the type field's value describing at least one of a transmission system type, a used protocol, and an antenna technology type; and cause to be transmitted by a transmitter the L1 signaling information with configurable code rates and configurable modulation.

30. The non-transitory computer readable medium of claim 29, wherein the computer executable instructions, when executed, cause the processor to interleave the L1 pre-signaling information over fixed preamble symbols.

* * * * *